United States Patent
Kennel et al.

(10) Patent No.: US 10,497,814 B2
(45) Date of Patent: Dec. 3, 2019

(54) III-V SEMICONDUCTOR ALLOYS FOR USE IN THE SUBFIN OF NON-PLANAR SEMICONDUCTOR DEVICES AND METHODS OF FORMING THE SAME

(71) Applicant: Intel Corporation, Santa Clara, CA (US)

(72) Inventors: Harold W. Kennel, Portland, OR (US); Matthew V. Metz, Portland, OR (US); Willy Rachmady, Beaverton, OR (US); Gilbert Dewey, Hillsboro, OR (US); Chandra S. Mohapatra, Hillsboro, OR (US); Anand S. Murthy, Portland, OR (US); Jack T. Kavalieros, Portland, OR (US); Tahir Ghani, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/529,432

(22) PCT Filed: Dec. 23, 2014

(86) PCT No.: PCT/US2014/072219
§ 371 (c)(1),
(2) Date: May 24, 2017

(87) PCT Pub. No.: WO2016/105397
PCT Pub. Date: Jun. 30, 2016

(65) Prior Publication Data
US 2018/0323310 A1    Nov. 8, 2018

(51) Int. Cl.
*H01L 29/786* (2006.01)
*H01L 29/66* (2006.01)
(Continued)

(52) U.S. Cl.
CPC .... *H01L 29/78681* (2013.01); *H01L 27/0605* (2013.01); *H01L 29/1054* (2013.01);
(Continued)

(58) Field of Classification Search
CPC .......... H01L 29/78681; H01L 29/1054; H01L 29/7783; H01L 29/785; H01L 29/78;
(Continued)

(56) References Cited

U.S. PATENT DOCUMENTS

| | | |
|---|---|---|
| 3,676,228 A | 7/1972 | Takeshi Sakurai et al. |
| 4,035,205 A | 7/1977 | Jacques et al. |

(Continued)

FOREIGN PATENT DOCUMENTS

| | | |
|---|---|---|
| EP | 0390552 A2 | 10/1990 |
| GB | 1319852 A | 6/1973 |
| KR | 101401274 B1 | 5/2014 |

OTHER PUBLICATIONS

Supplementary European Search Report received in European Patent Application No. 14909239.7, dated Jul. 23, 2018, 6 pages.
(Continued)

*Primary Examiner* — Sonya D. McCall-Shepard
(74) *Attorney, Agent, or Firm* — Grossman, Tucker, Perreault & Pfleger, PLLC

(57) ABSTRACT

Semiconductor devices including a subfin including a first III-V semiconductor alloy and a channel including a second III-V semiconductor alloy are described. In some embodiments the semiconductor devices include a substrate including a trench defined by at least two trench sidewalls, wherein the first III-V semiconductor alloy is deposited on the substrate within the trench and the second III-V semiconductor alloy is epitaxially grown on the first III-V semiconductor alloy. In some embodiments, a conduction band offset between the first III-V semiconductor alloy and the second III-V semiconductor alloy is greater than or equal to about 0.3 electron volts. Methods of making such semiconductor devices and computing devices including such semiconductor devices are also described.

15 Claims, 11 Drawing Sheets

(51) Int. Cl.
  *H01L 27/06* (2006.01)
  *H01L 29/10* (2006.01)
  *H01L 29/778* (2006.01)
  *H01L 29/78* (2006.01)
(52) U.S. Cl.
  CPC .... *H01L 29/66795* (2013.01); *H01L 29/7783* (2013.01); *H01L 29/78* (2013.01); *H01L 29/785* (2013.01)
(58) Field of Classification Search
  CPC ........... H01L 27/0605; H01L 27/14632; H01L 27/1469; H01L 27/14687; H01L 27/14636; H01L 27/14645; H01L 27/14685; H01L 27/14618; H01L 27/14634; H01L 27/14625; H01L 31/0203; H01L 2924/00014; H01L 2224/04042; H01L 2224/48463; H01L 24/05

See application file for complete search history.

(56) References Cited

U.S. PATENT DOCUMENTS

| | | | |
|---|---|---|---|
| 5,268,582 A | 12/1993 | Kopf et al. | |
| 5,271,028 A | 12/1993 | Kondo et al. | |
| 5,375,137 A | 12/1994 | Hirayama et al. | |
| 5,376,583 A | 12/1994 | Northrup et al. | |
| 5,399,917 A | 3/1995 | Allen et al. | |
| 5,434,531 A | 7/1995 | Allen et al. | |
| 5,619,664 A | 4/1997 | Glew | |
| 5,663,592 A | 9/1997 | Miyazawa et al. | |
| 7,872,252 B2 | 1/2011 | Puetz et al. | |
| 8,765,563 B2 | 7/2014 | Pillarisetty et al. | |
| 9,337,255 B1* | 5/2016 | Basu | H01L 29/0603 |
| 2010/0301390 A1 | 12/2010 | Chih-Hsin et al. | |
| 2011/0147798 A1 | 6/2011 | Radosavljevic et al. | |
| 2011/0210374 A1 | 9/2011 | Lochtefeld | |
| 2012/0091528 A1 | 4/2012 | Chang et al. | |
| 2012/0318334 A1 | 12/2012 | Bedell et al. | |
| 2013/0134481 A1 | 5/2013 | Kumar et al. | |
| 2013/0154016 A1 | 6/2013 | Glass et al. | |
| 2013/0193482 A1 | 8/2013 | Bahman et al. | |
| 2013/0277752 A1 | 10/2013 | Glass et al. | |
| 2013/0285155 A1 | 10/2013 | Glass et al. | |
| 2014/0008700 A1 | 1/2014 | Rachmady et al. | |
| 2014/0054547 A1* | 2/2014 | Eneman | H01L 29/785 257/24 |
| 2014/0084343 A1 | 3/2014 | Dewey et al. | |
| 2014/0175515 A1 | 6/2014 | Then et al. | |
| 2014/0191287 A1 | 7/2014 | Adam et al. | |
| 2014/0264438 A1 | 9/2014 | Holland et al. | |
| 2014/0312388 A1 | 10/2014 | Colinge | |
| 2014/0332855 A1 | 11/2014 | Cheng et al. | |
| 2017/0345900 A1 | 11/2017 | Kennel et al. | |

OTHER PUBLICATIONS

Supplementary European Search Report received in European Patent Application No. 14909240.5, dated Jul. 25, 2018, 11 pages.
Waldron N et al, "Integration of InGaAs channel n-MOS devices on 200mm Si wafers using the aspect-ratio-trapping technique", 221st ECS Meeting, Seattle, WA, May 6-May 10, 2012, vol. 45, No. 4, pp. 115-128 (XP002716484), 14 pages.
Minari H et al, "Defect formation in III-V fin grown by aspect ratio trapping technique: A first-principles s", 2014 IEEE International Reliability Physics Symposium, IEEE, Jun. 1, 2014 (XP0326222208) [retrieved on Jul. 18, 2014] the whole document, 5 pages.
International Search Report and Written Opinion issued in PCT Application No. PCT/US2014/072213, dated Sep. 23, 2015, 11 pages.
International Preliminary Report on Patentability and Written Opinion issued in PCT Application No. PCT/US2014/072213, dated Jun. 27, 2017, 7 pages.
Office Action issued in U.S. Appl. No. 15/527,221, dated Oct. 27, 2017, 16 pages.
International Preliminary Report on Patentability and Written Opinion issued in PCT Application No. PCT/US2014/072219, dated Jun. 27, 2017, 7 pages.
International Search Report and Written Opinion issued in PCT Application No. PCT/US2014/072219, dated Sep. 18, 2015, 9 pages.
Office Action issued in U.S. Appl. No. 15/527,221, dated Apr. 2, 2018, 11 pages.
Taiwan Office Action received in Taiwan Patent Application No. 104138528, dated Jul. 22, 2019, 14 pages.

* cited by examiner

Deposit Gate

III-V SEMICONDUCTOR ALLOYS FOR USE IN THE SUBFIN OF NON-PLANAR SEMICONDUCTOR DEVICES AND METHODS OF FORMING THE SAME

FIELD

The present disclosure relates to non-planar semiconductor devices that include one or more III-V semiconductor alloys as a subfin material. Methods of manufacturing such devices are also described.

BACKGROUND

Transistors and other semiconductor devices may be fabricated through a number of subtractive and additive processes. Certain benefits, such as channel mobility for transistors, may be obtained by forming the device layers in semiconductor material other than silicon, such as germanium and III-V materials. Where a crystalline material such as silicon serves as a starting material, epitaxial growth techniques (e.g., hetero-epitaxy) may be utilized to additively form a transistor channel including non-silicon materials on the substrate. Such processes can be challenging for a number of reasons, including but not limited to mismatch between the lattice constants and/or thermal properties of the substrate and the layers epitaxially grown thereon.

Manufacturers of silicon-based field effect transistor (FET) devices have now commercialized devices employing non-planar transistors. Such devices may include a silicon fin that protrudes from a substrate and includes a subfin region (e.g., at least a portion of which is below the surface of a trench dielectric) and an overlying channel. Such devices may also include one or more gate electrodes (hereinafter, "gate" or "gates") that wrap around two, three, or even all sides of the channel (e.g., dual-gate, tri-gate, nanowire transistors, etc.). On either side of the gate, source and drain regions are formed in the channel or are grown in such a way as to be coupled to the channel. In any case, these non-planar transistor designs often exhibit significantly improved channel control as well as improved electrical performance (e.g., improved short channel effects, reduced short-to-drain resistance, etc.), relative to planar transistors.

Although the devices described above have potential, they may suffer from one or more drawbacks that may limit their usefulness. For example, subfin leakage (leakage between the source and drain of the channel via the subfin region) may hinder the ability of a gate to turn the non-planar transistor OFF. With this in mind, one approach for containing subfin leakage in non-planar devices such as those described above is to dope the subfin region with a dopant of a type (P or N) that is opposite the dopant used in source and drain. Although this approach can be effective, dopant diffusion and Debye lengths can limit the abruptness of the barrier to subfin leakage that is created by this approach.

Design of the conduction band offset (CBO) between the subfin region and the channel of a non-planar semiconductor device is another approach for containing subfin leakage. In that approach, relatively wide CBO and an abrupt heterojunction may be employed to confine channel electrons to the channel region and prevent them from leaking into the subfin region. Manufacturing and existing material considerations, however, can limit the practical usefulness of that approach.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Figure 1A:
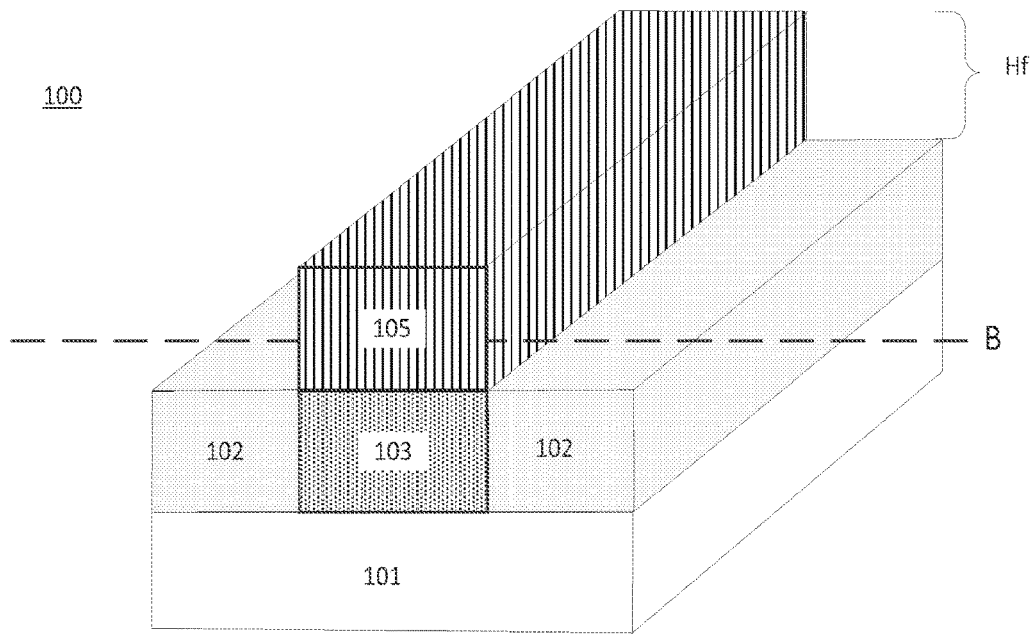
FIG. 1A is a block diagram of a portion of a non-planar transistor including a channel consistent with the present disclosure.

Although the following Detailed Description will proceed with reference being made to illustrative embodiments, many alternatives, modifications, and variations thereof will be apparent to those skilled in the art.

DETAILED DESCRIPTION

The terms "over," "under," between," and "on," are often used herein to refer to a relative position of one material layer or component with respect to other material layers or components. For example, one layer disposed on (e.g., over or above) or under (below) another layer may be directly in contact with the other layer, or may have one or more intervening layers. Moreover one layer disposed between two other layers may be directly in contact with the two other layers or may be separated by one or more of the other layers, e.g., by one or more intervening layers. Similarly unless expressly indicated to the contrary, one feature that is adjacent to another feature may be in direct contact with the adjacent feature, or may be separated from the adjacent feature by one or more intervening features. In contrast, the terms "directly on" or "directly below" are used to denote that one material layer is in direct contact with an upper surface or a lower surface, respectively, of another material layer. Likewise, the term "directly adjacent" means that two features are in direct contact with one another.

As noted in the background interest has grown in non-planar semiconductor devices such as FINFETs and other non-planar transistors. Although such devices have shown significant promise, they may suffer from one or more drawbacks that may limit their practical usefulness. In particular such devices may suffer from subfin leakage, which may hinder or prevent a gate from turning the device OFF. Although various approaches to mitigating subfin leakage have been investigated, the effectiveness of such approaches may be hindered by material and manufacturing considerations.

For example, one approach for mitigating subfin leakage is to design a semiconductor device such that a relatively large conduction band offset (CBO) exists between a subfin region of the device and an overlying channel. Although this is a promising technique for reducing subfin leakage, its effectiveness may be affected by various factors such as the materials used, the quality of the material layer(s) deposited to form the subfin region of a device, and/or the quality of the material layer(s) deposited to form the channel of a device.

The inventors have conducted an investigation into the use of III-V compound semiconductor materials to form the subfin region and channel of a fin-based semiconductor device, such as FINFET or other non-planar transistors. In such devices one or more layers of a first III-V compound semiconductor may be deposited within a trench, e.g., to form a subfin region. One or more layers of a second III-V compound semiconductor may then be deposited on the layer(s) of first III-V compound semiconductor, e.g., to form a channel. Portions of the channel may be doped to form a source and drain, and a gate stack may be formed on at least a part of the channel. The gate stack may include a gate electrode that is configured to modulate the operation of the device, i.e., to turn the device ON or OFF.

Figure 1B:
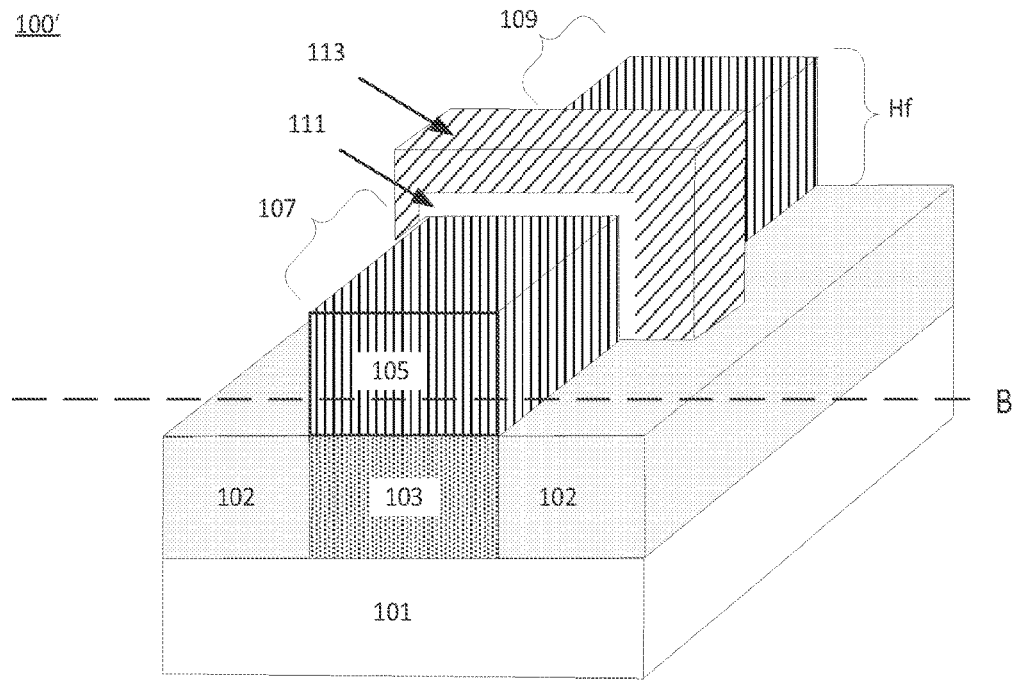
FIG. 1B is a block diagram of one example of a non-planar transistor including a channel in accordance with FIG. 1A, as well as a gate stack, consistent with the present disclosure.

As one example of the structure of such devices reference is made to FIGS. 1A and 1B. FIG. 1A shows one example of a portion of a non-planar semiconductor device 100 consistent with the present disclosure, in this case a portion of a FINFET. As shown, device 100 includes a substrate 100, trench dielectric 102, a subfin region 103, and a channel 105. As shown in FIG. 1B, a gate stack (e.g., formed by gate dielectric 111 and gate electrode 113) may be formed over the channel 105, resulting in the production of a non-planar semiconductor device 100', e.g., a FINFET.

With the foregoing in mind, the inventors have determined that by forming subfin region 103 and channel 105 with certain III-V semiconductor alloys (also referred to herein as III-V compound semiconductors), relatively high CBO may be achieved between subfin region 103 and channel 105. For example, when an alloy of indium, gallium and arsenic (InGaAs) is selected for use as channel 105, a relatively high conduction band offset may be achieved by forming subfin region 103 from an alloy of indium, aluminum and arsenic (InAlAs) or an alloy of aluminum, arsenic and antimony (AlAsSb), either of which is substantially lattice matched with InAlAs.

While AlAsSb and InAlAs have shown promise for use in subfin region 103, their relatively large aluminum content presents challenges with regard to depositing such materials with an acceptable level of quality within the confines of a trench such as the trench defined by the sidewalls of trench dielectric 102 and an upper surface of substrate 101. Indeed due to chemical interaction between the aluminum in InAlAs and AlAsSb and components (e.g., oxygen) within trench dielectric 102, stress and/or defects may be introduced into subfin region 103 as one or more layers of such materials is/are deposited. The resulting layer(s) of AlAsSb and/or InAlAs may therefore be of relatively poor quality. Moreover, the introduction of stress and/or defects into the deposited layer(s) of AlAsSb and/or InAlAs may increase the difference between the lattice parameters of such materials (as deposited) and the lattice parameters of the material(s) selected to form channel 105, in this case InGaAs. As a result, high quality epitaxial growth of InGaAs or other channel materials may be impeded or even prevented.

With the foregoing in mind the present disclosure generally relates to non-planar semiconductor devices that include a subfin including one or more layers of a first III-V semiconductor alloy, and a channel including one or more layers of a second III-V semiconductor alloy. Methods of manufacturing such devices are also described.

As will be described in detail below, the composition of the first III-V semiconductor alloys described herein for use in forming the subfin region of a semiconductor device may be tailored to exhibit relatively small or no lattice mismatch with one or more materials selected for use as an overlying channel. The first III-V semiconductor alloys may also include a relatively low concentration of elements that are reactive with oxygen or other elements that may be found in a trench dielectric. As a result, layers of the first III-V semiconductor alloys described herein may be deposited within a trench with relatively high quality. That is, layers of such materials may be grown within the confines of a trench without significant introduction of defects and/or stress due, for example, to limited chemical interaction of such materials with elements in the trench sidewalls. As such, the first III-V semiconductor alloys described herein may be used to form a subfin region that can support high quality epitaxial growth of a channel thereon. In some embodiments, a sharp transition (junction) between the subfin region and the channel may also be attained through the use of such materials.

Alternatively or in addition to the above noted features, in some embodiments the III-V semiconductor alloys described herein may enable the production of devices in which there is a relatively large conduction band offset between a subfin region and an overlying channel. As may be appreciated, this relatively high conduction band offset may limit or even eliminate subfin leakage in the resulting device.

It is noted that for the sake of illustration, the present disclosure focuses on example use cases in which a first III-V semiconductor alloy is used to form a subfin region of a non-planar semiconductor device such as a FINFET, a multigate (e.g., double gate, tri-gate, etc.) transistor, or the like. It should be understood that such discussion is for the sake of example only, and the technologies described herein may be extended to other use cases as may be appropriate and appreciated by one of ordinary skill in the art.

With the foregoing in mind, one aspect of the present disclosure relates to non-planar semiconductor devices that include one or more first III-V semiconductor alloys as a subfin material. In this regard reference is again made to FIG. 1A, which as noted previously depicts a device 100 that includes a substrate 101, trench dielectric 102, subfin region 103, and channel 105.

Substrate 101 may be formed of any material that is suitable for use as a substrate of a semiconductor device, and in particular as a substrate for non-planar transistors such as FINFETS and multi-gate transistors. Non-limiting examples of suitable materials that may be used as substrate 101 therefore include silicon (Si), germanium (Ge), silicon-germanium (SiGe), silicon-carbide (SiC), sapphire, a III-V compound semiconductor, a silicon on insulate (SOI) substrate, combinations thereof, and the like. Without limitation, in some embodiments substrate 101 is formed from or includes single crystal silicon.

In some embodiments one or more underlayers (not illustrated) may be deposited on substrate 101, e.g., such that they are present between substrate 101 and one or more of trench dielectric 102 and the materials forming subfin region 103. For example, one or more semiconductor base layers may be deposited on substrate 101. When used, such base layers may be pseudomorphic, metamorphic, or substantially lattice matched buffer and/or transition layers, as understood in the art. In any case, substrate 101 may be understood to provide an epitaxial seeding surface (e.g., a crystalline surface having a (100) or other suitable orientation) for the subsequent deposition of the materials of subfin region 103.

In the embodiment of FIG. 1A, a trench (not separately labeled) is defined by the sidewalls of trench dielectric 102 (hereinafter, trench sidewalls) and an upper portion of substrate 101. Thus in this example embodiment, a trench is defined by at least two trench sidewalls (of trench dielectric 102) and an upper surface of substrate 101.

The dimensions of the trench may vary widely, and a trench of any suitable dimension may be used. Without limitation, in some embodiments the height and width of the trenches described herein are selected so as to enable the deposition of the materials used to form subfin region 103 and/or channel 105 via an aspect ratio trapping (ART) process. Accordingly, in some embodiments the width of the trenches described herein may range from about greater than 0 to about 500 nanometers (nm), such as greater than 0 to about to about 300 nm, about greater than 0 to about 100 nm, about 5 to about 100 nm, or even about 5 to about 30 nm. Likewise the height of the trenches may vary widely and may range, for example, from greater than 0 to about 500 nm, such as about 100 to about 300 nm.

Trench dielectric 102 may be formed from any material that is suitable for use as a trench dielectric material of a non-planar semiconductor device. Non-limiting examples of such materials include oxides, nitrides and alloys, such as but not limited to silicon oxide ($SiO_2$), silicon nitride (SiN), combinations thereof, and the like. Without limitation, in some embodiments trench dielectric 102 is $SiO_2$.

Trench dielectric 102 may be formed in any suitable manner. For example, trench dielectric 102 may be formed by depositing one or more layers of dielectric material (e.g., $SiO_2$) on substrate 101, e.g., via chemical vapor deposition (CVD), plasma enhanced CVD, or another suitable deposition process. The resulting deposited layer may be planarized, and an etching process may be used to remove portions of the dielectric material so as to form a trench. Of course this process is for the sake of example only, and other processes may be used to form a trench consistent with the present disclosure. For example, a trench may be formed by etching substrate 101 to form one or more fins, depositing trench dielectric 102 around the fin, and removing the portion of substrate 101 forming the fin so as to form a trench bounded by trench dielectric 102 and an upper surface of substrate 101.

It should also be understood that the trenches described herein need not be formed on an upper surface of substrate 101, e.g., as shown in FIGS. 1A and 1B. Indeed the present disclosure envisions embodiments in which a trench may be formed within substrate 101, e.g., via chemical etching or another suitable trench forming process. In such instances, one or more trench dielectric materials such as $SiO_2$, TiN, etc. may be selectively deposited within the trench, e.g., on the sidewalls thereof. One or more material layers of subfin region 103 and/or channel 105 may then be deposited within the trench.

In more general terms, in some embodiments the non-planar semiconductor devices include a substrate and at least one trench that is formed on or within the substrate. The trench may be defined by at least two opposing sides (trench sidewalls) and a bottom. The bottom of the trench may be in the form of an upper surface of the substrate, and/or one or more buffer and/or transition layers deposited on the substrate.

In any case, subfin region 103 of device 100 may be formed within the trench, and channel 105 may be formed on subfin region 103. In general, subfin region 103 may include and/or be formed of one or more layers of a first III-V semiconductor alloy and channel 105 may include and/or be formed from one or more layers of a second III-V semiconductor alloy. As such, it may be understood that in some embodiments that one of more layers of the material(s) in subfin region 103 may be in direct contact with the upper surface of substrate 101 and the trench sidewalls, e.g., as shown in FIGS. 1A and 1B. It should be understood however that this illustration is for the sake of example only, and that the materials of subfin region 103 need not be formed in direct contact with substrate 101 and the trench sidewalls. Indeed the present disclosure envisions embodiments in which subfin region 103 is formed on the upper surface of substrate 101, e.g., wherein one or more layers (e.g., buffer layers, epitaxial seeding layers, etc.) are formed between the material(s) of subfin region 103 and substrate 101. Likewise the present disclosure envisions embodiments in which one or more layers (e.g., trench isolation oxide, etc.) are present between the trench sidewalls defined by trench dielectric 102 and subfin region 103. Without limitation, in some embodiments subfin region 103 includes one or more layers of a first III-V semiconductor alloy, wherein at least one layer of the first III-V semiconductor alloy is in direct contact with an upper surface of substrate 101 and trench sidewalls defined by trench dielectric 102. Without limitation, in some embodiments the materials used to form the first and second III-V semiconductor alloys are chosen such that the second semiconductor III-V semiconductor alloy may be hetero-epitaxially grown on the first III-V semiconductor alloy. The first and second III-V semiconductor alloys may therefore be selected based at least in part on the relative differences between their respective lattice parameters. In some embodiments, the first and second III-V semiconductor alloys may be substantially lattice matched, i.e., the difference between their respective lattice parameters may be sufficiently low as to enable hetero-epitaxial growth of a layer of the second III-V semiconductor alloy on a layer of the first III-V semiconductor alloy. As used herein, the term "substantially lattice matched" means that the relative difference between corresponding lattice parameters of two III-V compound semiconductors is supportive of epitaxial growth and does not substantially impact the properties of the heterojunction. In some embodiments, substantially lattice matched means that the relative difference between such lattice parameters is less than or equal to about 5%, or even less than or equal to about 1%. For example in some embodiments the lattice parameters of at least one layer of subfin region 103 differ from at least one layer of channel 105 by less than or equal to about 1%.

Alternatively or in addition to the foregoing, the first and second III-V semiconductor alloys may be selected such that a relatively high conduction band offset (CBO) exists between subfin region 103 and channel 105. As used herein, "relatively high conduction band offset" means that the offset between the conduction bands of the first III-V semiconductor alloy of subfin region 103 and the second III-V semiconductor alloy of channel 105 is greater than or equal to a threshold conduction band offset. In some embodiments, the first and second III-V semiconductor alloys are preferably selected such that the CBO between subfin region 103 and channel 105 is greater than or equal to a threshold CBO of about 0.2 electron volts (eV), greater than or equal to a threshold CBO of about 0.3 eV, or even greater than or equal to a threshold CBO of about 0.4 eV. In some embodiments the first and second III-V semiconductor alloys are selected such that the CBO between subfin region 103 and channel 105 ranges from greater than or equal to about 0.3 eV and about 0.8 eV, such as greater than or equal to about 0.3 eV and about 0.7 eV.

In some embodiments the first and second III-V semiconductor alloys may be selected such that material layers of such materials are substantially lattice matched, and a conduction band offset between such layers meets or exceeds a threshold conduction band offset. For example in some embodiments the first and second III-V semiconductor alloys may be selected such that a layer of the second III-V semiconductor alloy is substantially lattice matched to an underlying layer of first III-V semiconductor alloy. As a result, the layer of the second III-V semiconductor alloy may be hetero-epitaxially grown on a layer of the first III-V semiconductor alloy. In such embodiments, the first and second III-V semiconductor alloys may also be selected such that a conduction band offset between the layer of the second III-V semiconductor alloy and the underlying layer of the first III-V semiconductor alloy is within the CBO ranges stated above, or greater than or equal to the CBO values stated above.

With the foregoing in mind, the present disclosure envisions a wide variety of first and second III-V semiconductor alloys that may be used to form one or more layers of subfin region 103 and channel 105, respectively. In some embodiments, the first III-V semiconductor alloy is a quaternary III-V semiconductor alloy, and the second III-V semiconductor alloy is a ternary or quaternary III-V semiconductor alloy. Without limitation, in some embodiments the first III-V semiconductor alloy is a quaternary alloy containing aluminum, and the second III-V semiconductor alloy is a ternary III-V semiconductor alloy.

As noted above quaternary III-V semiconductor alloys are one example of a class of III-V semiconductor alloys that may be used as a first III-V semiconductor alloy consistent with the present disclosure. Non-limiting examples of suitable quaternary III-V semiconductor alloys include but are not limited to quaternary III-V alloys containing aluminum. Examples of such alloys include quaternary alloys of indium (In), aluminum (Al), gallium (Ga), and arsenic ((As); i.e., InAlGaAs)), and alloys of aluminum, gallium, arsenic, and antimony ((Sb); i.e., AlGaAsSb)).

Without limitation, in some embodiments the first III-V semiconductor alloy used in subfin region 103 is a quaternary InAlGaAs alloy of the formula $Al_xGa_{0.48-x}In_{0.52}As_y$, wherein Al, Ga, and In occupy the group III sublattice of the alloy, As occupies the group V sublattice of the alloy, x is the mole fraction of aluminum in the group III sublattice, and y is the mole fraction of As in the group V sublattice. In such embodiments y may equal 1, and x may range from greater than 0 to less than about 0.48, and in some embodiments may range from greater than or equal to about 0.1 to less than or equal to about 0.48, greater than or equal to about 0.2 to less than or equal to about 0.48, or even greater than or equal to about 0.3 to less than or equal to about 0.48. Without limitation, in some embodiments subfin region 103 is formed from one or more layers of a first III-V semiconductor alloy, wherein the first III-V semiconductor alloy is a quaternary $Al_xGa_{0.48-x}In_{0.52}As_y$ alloy in which y=1 and x ranges from greater than or equal to about 0.3 to less than or equal to about 0.48.

In other non-limiting embodiments, the first III-V semiconductor alloy used in subfin region 103 is a quaternary AlGaAsSb of the formula $Al_xGa_{1-x}As_ySb_{1-y}$, wherein Al and Ga occupy the group III sublattice of the alloy, As and Sb occupy the group V sublattice of the alloy, x is the mole fraction of aluminum in the group III sublattice, and y is the mole fraction of As in the group V sublattice. In such embodiments y may range from greater than 0 to less than or equal to about 1, such as greater than 0 to less than or equal to about 0.5, and x may range from greater than 0 to about 0.5, such as greater than 0 to less than or equal to about 0.48, about 0.1 to less than or equal to about 0.48, or even about 0.2.

In some embodiment the first III-V semiconductor alloy(s) used in subfin region 103 may contain a relatively small concentration of elements that are reactive to one or more elements in trench dielectric 102. For example where trench dielectric includes oxygen (e.g., in instances where trench dielectric 102 is an oxide such as $SiO_2$), the composition of the first III-V semiconductor alloy(s) used in subfin region may be tailored to contain relatively small concentration of elements that are reactive to oxygen. With regard to the quaternary alloys containing aluminum mentioned above, for example, the aluminum in such alloys may be highly reactive with oxygen in trench dielectric 102. As a result when one or more layers of such materials are deposited within a trench bounded by trench dielectric 102, some portion of the aluminum in such alloys may react with oxygen in trench dielectric 102. Such reactions may introduce stress and or defects into subfin region 103, which as noted above may hinder heteroepitaxial growth of channel 105 thereon.

Non-limiting examples of III-V semiconductor alloys that may be used as second III-V semiconductor alloys for forming one or more layers of a channel consistent with the present disclosure include binary, ternary, and quaternary III-V semiconductors such as InAs, InAsSb, InGaAs, InSb, AlGaAs, GaAs, combinations thereof, and the like. Without limitation, in some embodiments channel 105 is formed from one or more layers of an InGaAs alloy, such as but not limited to an $In_{53}Ga_{47}As$ alloy, in which In and Ga are present in the group III sublattice, and As is present in the group V sublattice. Of course these III-V alloys are enumerated for example only, and it should be understood that any suitable III-V semiconductor may be used as a second III-V semiconductor alloy. In this regard, the present disclosure envisions embodiments wherein the second III-V semiconductor is any one of the possible binary, ternary, and quaternary combinations of Al, Ga, and IN with P, As, and Sb. Binary III-V semiconductors such as GaN may also be suitable candidates for use as the second III-V semiconductor.

With the foregoing in mind, it may be advantageous to control the amount of aluminum or other elements in the first III-V semiconductor alloys described herein, so as to limit or avoid the introduction of stress and/or defects into subfin region 103 that may result from the interaction of such elements with components of trench dielectric 102. In this regard, in some embodiments the mole fraction of elements (e.g., Al) in the first III-V semiconductor alloys described herein that are reactive with components (e.g., oxygen) of trench dielectric 102 may be limited to less than or equal to about 0.5, such as less than about 0.48, less than about 0.4, from greater than 0 to about 0.48, from greater than 0.05 to about 0.48, or even from about 0.1 to about 0.48, relative to the total amount of elements in the alloy. As may be appreciated, the amount of aluminum in such materials is less than the amount of aluminum in the ternary InAlAs (mole fraction of Al on the group III sublattice ≥0.5), and AlAsSb (mole fraction of Al on the group III sublattice=1) alloys mentioned above.

In addition to controlling the amount of elements in the first III-V semiconductor alloys described herein that are reactive to components of the trench dielectric, it may be advantageous to control the composition of a first III-V semiconductor alloy such that it provides an epitaxial seeding surface that is substantially lattice matched to one or more layers of a second III-V semiconductor alloy used in channel 105. With this in mind, the inventors have discovered that in the context of the AlGaInAs and AlGaAsSb alloys noted above, the foregoing goals may be achieved by using Ga to substitute at least a portion of Al in the group III sublattice, e.g., as is the case with the $Al_xGa_{0.48-x}In_{0.52}As_y$ and $Al_xGa_{1-x}As_ySb_{1-y}$ alloys noted above.

Consistent with the foregoing discussion, in some embodiments a combination of first and second III-V semiconductor alloys may be selected for use in forming one or more layers of subfin region 103 and channel region 105, e.g., to attain certain desired properties. With this in mind, in some embodiments subfin region is formed from one or more layers of a first III-V semiconductor alloy, wherein the first III-V semiconductor alloy quaternary III-V semiconductor alloy such as InAlGaAs or AlGaAsSb, and channel 105 is formed from one or more layers of a second III-V semiconductor alloy, wherein the second III-V semiconductor alloy is a ternary III-V semiconductor alloy such as an In GaAs alloy.

In non-limiting embodiments, channel 105 is one or more layers of $In_{53}Ga_{47}As$, and subfin region 103 includes one or more layers of $Al_xGa_{0.48}In_{0.52}As_y$, or $Al_xGa_{1-x}As_ySb_{1-y}$, wherein x and y are as previously described in conjunction with such alloys. In such embodiments, at least one layer of $In_{53}Ga_{47}As$ in channel 105 may be heteroepitaxially grown from a surface of a layer of $Al_xGa_{0.48-x}In_{0.52}As_y$ or $Al_xGa_{1-x}As_ySb_{1-y}$, respectively. As will be described later, such combinations may allow the production of devices in which at least one layer of subfin region 103 is substantially lattice matched to at least one layer of channel 105, thereby enabling high quality hetero-epitaxial growth of one or more layers of channel 105 on subfin region 103. In addition, such combinations may enable the production of devices in which a relatively high conduction band offset exists between subfin region 103 and channel 105, thereby hindering or even preventing subfin leakage.

It is noted that FIGS. 1A and 1B depict embodiments in which subfin region 103 is a single layer of a first III-V semiconductor alloy and channel 105 is a single layer of a second III-V semiconductor alloy that is formed directly on subfin region 103 (i.e., on an upper surface of the layer of first III-V semiconductor alloy). It should be understood that such configuration is for the sake of example only, and that other configurations are possible. Indeed the present disclosure envisions embodiments in which one or more layers (e.g. buffer layers, interlayers, etc.) may be present between subfin region 103 and channel 105. Moreover the present disclosure envisions embodiments in which one or more of subfin region 103 and/or channel 105 are each formed of multiple layers, e.g., of one or more first and second III-V semiconductor alloys, respectively.

Regardless of the nature of the first and second III-V semiconductor alloys, portions of the channel 105 may be processed to form a source region 107 and a channel region 109, as generally shown in FIGS. 1B and 2A-2C. For example, in some embodiments source and drain regions 107, 109 may be formed by doping portions of a layer of the second III-V alloy in channel 105 with one or more P or N type dopants, as generally understood in the art.

As also shown in FIGS. 1B and 2A-2C, a gate stack (not separately labeled) may be formed over at least part of an exposed portion of channel 105. This concept is best shown in FIG. 1B, wherein a gate stack is formed over a portion of channel 105, and includes a gate electrode 113 which is isolated from channel 105 by gate dielectric 111. Gate electrode 113 and gate dielectric may be formed of any suitable gate electrode and gate dielectric material, and thus the nature of such materials is not described for the sake of brevity.

Figure 2A:
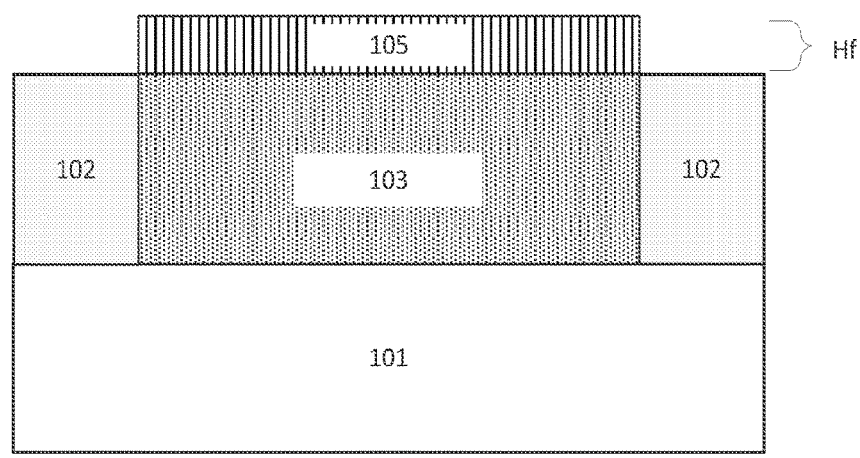
FIG. 2A is a cross sectional view of the example portion of a non-planar transistor of FIG. 1A, along axis B.
Figure 2B:
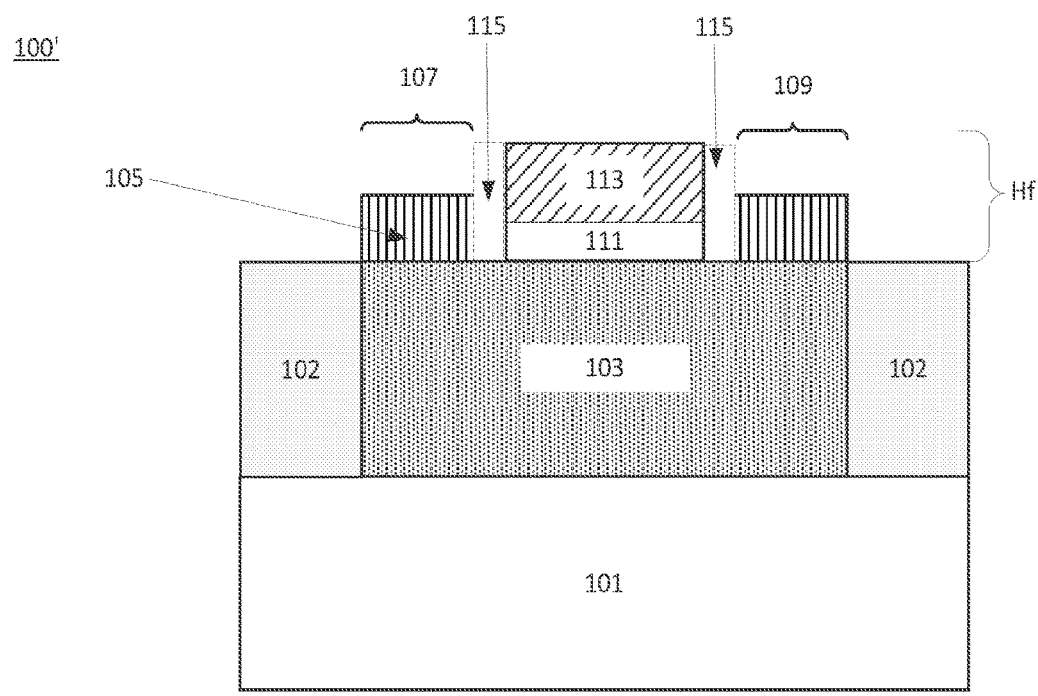
FIG. 2B is a cross-sectional view of the example non-planar transistor of FIG. 1B.
Figure 2C:
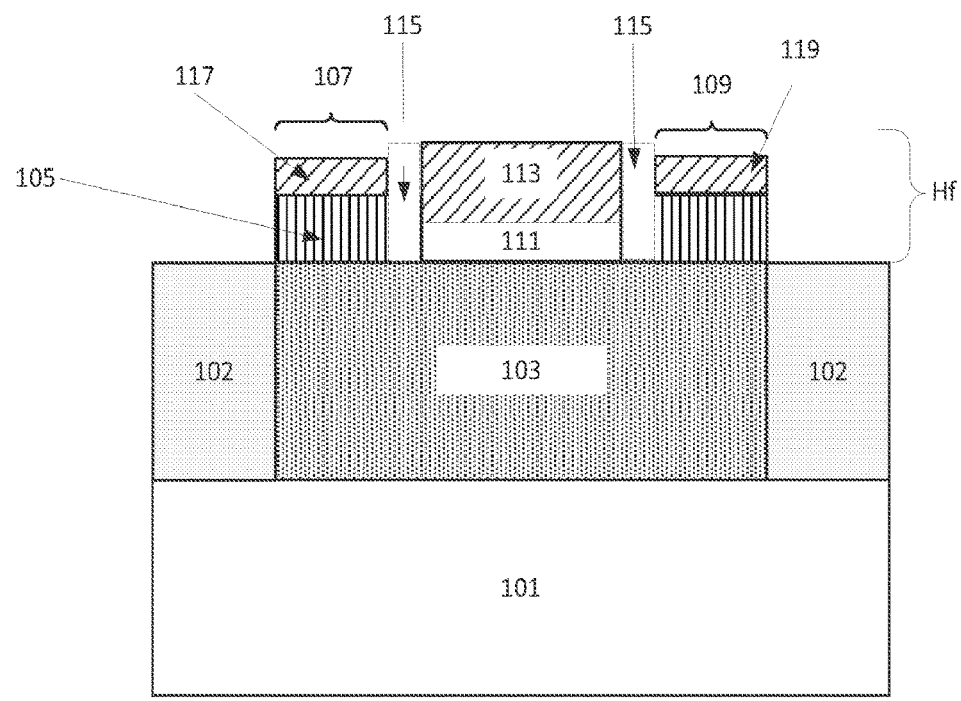
FIG. 2C is a cross-sectional view of one example of a non-planar transistor including a raised source and drain, consistent with the present disclosure.

It is noted that while FIGS. IA-B and IIA-B depict embodiments in which source 107 and drain 109 are embedded in channel 105, such configurations are not required and any suitable source/drain configuration may be employed. For example, the present disclosure envisions embodiments in which the non-planar semiconductor devices described herein utilize raised source and drain regions that may be grown on or otherwise coupled to channel 105. This concept is illustrated in FIG. 2C, which is a cross sectional view of one example configuration of a non-planar semiconductor device 100" in which a raised source and drain is used. More specifically, FIG. 2C depicts an embodiment in which device 100" includes the same elements as device 100' of FIG. 2B, but also includes a raised source 117 and a raised drain 119, which may be grown or otherwise coupled to respective portions of channel 105. In any case, a gate isolation spacer 115 may be formed to isolate raised source 117, raised drain 119, and source and drain regions 107, 109 from gate 113.

Although FIG. 1B depicts an embodiment in which gate electrode 113 and gate dielectric 111 are formed on three sides of layer 105 (e.g., to form a triple gate transistor), it should be understood that such illustration is for the sake of example only, and that gate electrode and/or gate dielectric 111 may be formed on one, two, three, or more sides of layer 105. Thus for example, a gate stack may be formed over a portion of channel 105, so as to form a single, double, or triple gates non-planar device, such as a single or multigate transistor. In some embodiments and as best shown in FIGS. 1B, 2B, and 2C, gate 113 may extend from an upper surface of channel 105 and down at least one side thereof, such that a bottom portion of gate 113 is proximate or adjacent trench dielectric 102.

In some embodiments, the non-planar devices described herein may be constructed such that a boundary (heterojunction) between subfin region 103 and channel 105 may be located at a desired position. For example and as shown in FIGS. 1A, 1B, and 2A-C, in some embodiments the boundary between subfin region 103 and channel 105 may be positioned at or near the base of channel 105. In this regard it is noted that channel 105 may have a height $H_f$, wherein the boundary between subfin region 103 and channel 105 is located at the bottom of $H_f$, as illustrated in FIGS. 1A, 1B, and 2A-2C. In some embodiments, the height of trench dielectric may be set such that an upper surface thereof is at the same or approximately the same height as the interface between subfin 103 and channel 105, as also shown in FIGS. 1A, 1B, and 2A-2C. Of course such illustrations are for the sake of example only, and the boundary between subfin region 103 and channel region 105, as well as the height of trench dielectric 102 may be configured in any suitable manner. For example in some embodiments the height of trench dielectric 102 may be such that the boundary between subfin region 103 and channel 105 is above or below an upper surface of trench dielectric 102.

As may be appreciated, it may be desirable to form subfin region 103 and channel 105 such that the transition from such regions is relatively abrupt. In this regard, the boundary between channel 105 and subfin region 103 may be defined by a transition width, wherein the transition width is less than or equal to about 5 nm, such as less than or equal to about 1 nm. In some embodiments, the transition width between subfin region 103 and channel 105 is less than 1 nm wide.

To further explain the above noted concepts the present disclosure will now proceed to describe several example embodiments in which the non-planar devices of FIGS. 1A, 1B, and 2A-2C include a subfin region 103 in the form of a single layer of an AlGaInAs or AlGaAsSb alloy, and channel 105 is in the form of a single layer of $In_{53}Ga_{47}As$ that is heteroepitaxially grown on the AlGaInAs or AlGaAsSb alloy, respectively. It should be understood that such examples are for the sake of illustration only, and that the technologies described herein may be extended to other suitable device configurations as may be understood by those of ordinary skill in the art.

Figure 3:
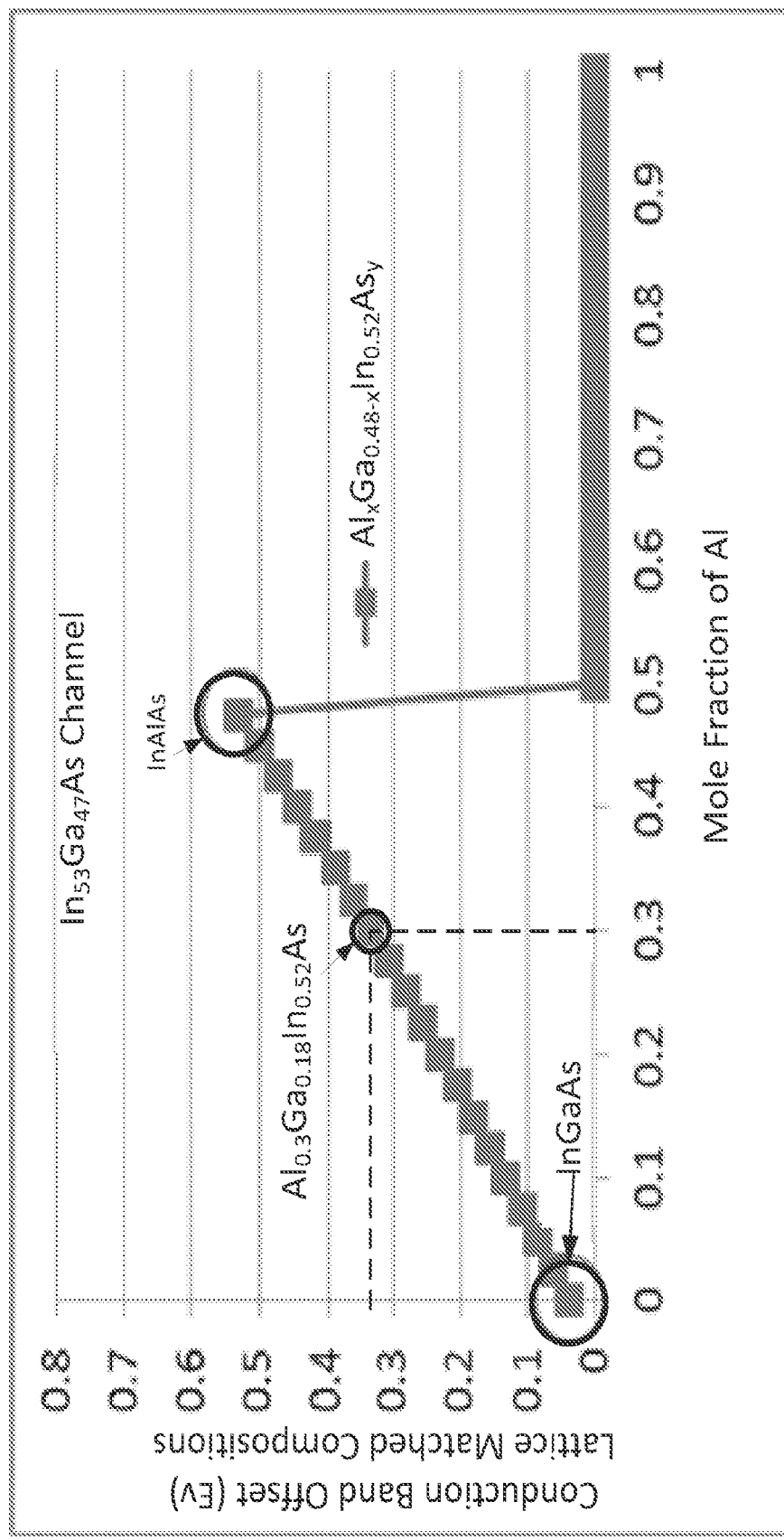
FIG. 3 is a graph plotting simulated conduction band offset vs. aluminum content of one example of a first quaternary III-V semiconductor alloy and one example of a second quaternary III-V semiconductor alloy, consistent with the present disclosure.

With the foregoing in mind reference is made to FIG. 3, which is a plot of simulated conduction band offset versus subfin alloy composition for a non-planar device including a channel 105 formed from a single layer of $In_{53}Ga_{47}As$ that is heteroepitaxially grown on a subfin region 103 formed from a single layer of $Al_xGa_{0.48-x}In_{0.52}As_y$, wherein y is the mole fraction of As and is equal to 1. More particularly, FIG. 3 is a plot of simulated CBO between a layer of $In_{53}Ga_{47}As$ and a layer $Al_xGa_{0.48-x}In_{0.52}As_y$, versus the mole fraction (x) of aluminum in the layer of $Al_xGa_{0.48-x}In_{0.52}As_y$. It is noted that in these simulated plots the composition of the layer of $Al_xGa_{0.48-x}In_{0.52}As_y$, and the layer of $In_{53}Ga_{47}As$ were selected so as to be exactly lattice matched for all values of x.

As shown in FIG. 3, relatively high CBO (e.g., CBO≥about 0.2) is expected when the mole fraction (x) of Al in the $Al_xGa_{0.48-x}In_{0.52}As_y$ is greater than or equal to about 0.2. Indeed, a CBO of ≥about 0.3 is expected when the mole fraction (x) of Al in $Al_xGa_{0.48-x}In_{0.52}As_y$ is greater than or equal to about 0.3, with the expected CBO increasing as the mole fraction (x) of Al increases to less than about 0.48. As may be appreciated, FIG. 3 indicates that when a layer of $Al_xGa_{0.48-x}In_{0.52}As_y$ is used in subfin region 103, its composition may be tailored to include relatively little aluminum (thus potentially reducing interaction of the material with the sidewall of a trench), while at the same time providing a lattice matched epitaxial seeding surface for an overlying channel. Moreover such alloys may also enable the production of devices that with relatively high CBO between subfin region 103 and channel 105, which as noted above may limit or even prevent subfin leakage in such devices.

Figure 4:
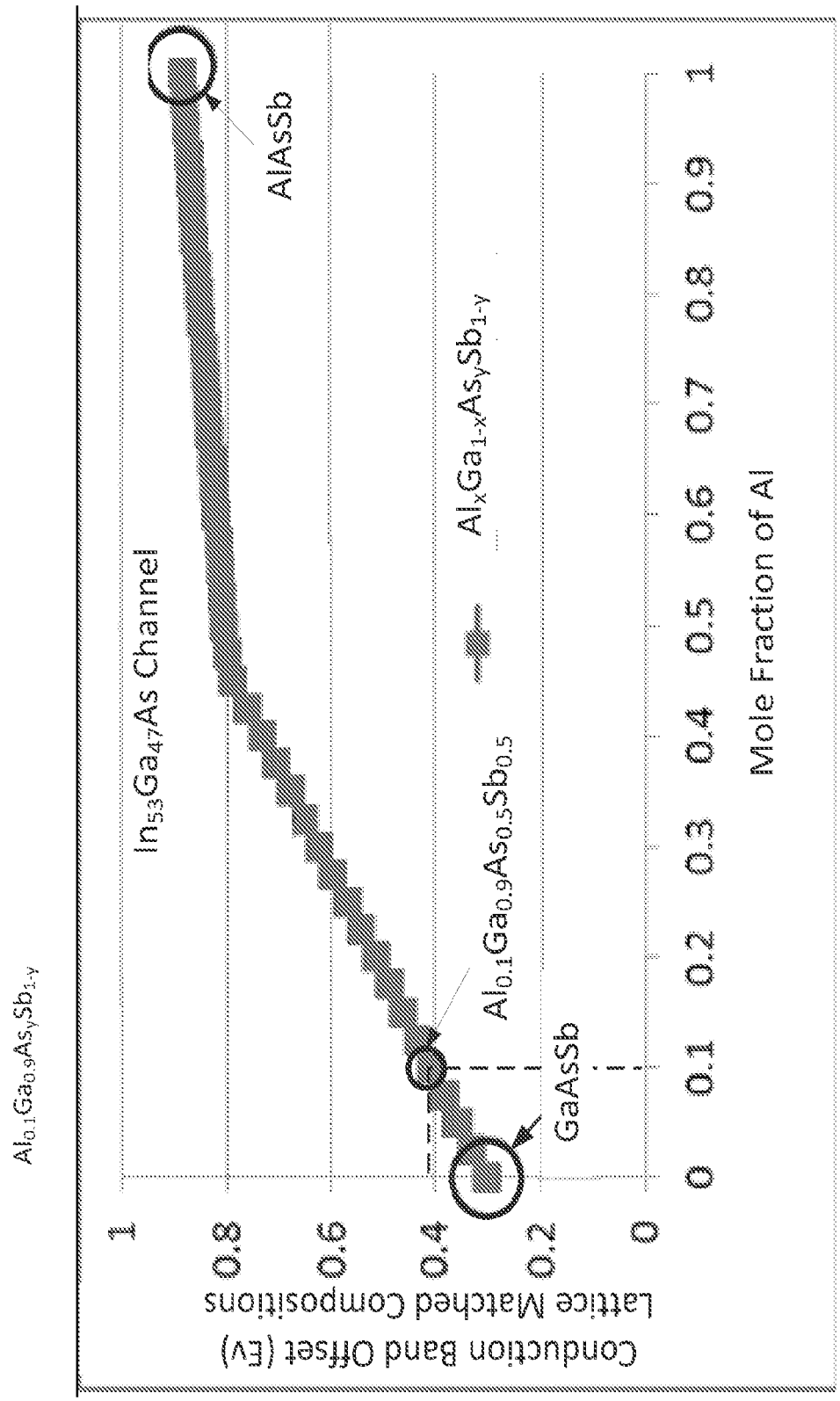
FIG. 4 is a graph plotting simulated conduction band offset vs. aluminum content of another example of a first quaternary III-V semiconductor alloy and one example of a second quaternary III-V semiconductor alloy, consistent with the present disclosure.

Moving on, reference is now made to FIG. 4, which is a plot of simulated conduction band offset versus subfin alloy composition for a non-planar device including a channel 105 formed from a single layer of $In_{53}Ga_{47}As$ that is heteroepitaxially grown on a subfin region 103 formed from a single layer of $Al_xGa_{1-x}As_ySb_{1-y}$, wherein y is the mole fraction of As and is equal to 1. More particularly, FIG. 3 is a plot of simulated CBO between a layer of $In_{53}Ga_{47}As$ and a layer $Al_xGa_{1-x}As_{0.5}Sb_{0.5}$, versus the mole fraction (x) of aluminum in the layer of $Al_xGa_{1-x}As_{0.5}Sb_{0.5}$. It is noted that the composition of the layer of $Al_xGa_{0.48-x}In_{0.52}As_y$, and the layer of $In_{53}Ga_{47}As$ were selected to as to be exactly lattice matched for all values of x.

As shown in FIG. 4, relatively high CBO (e.g., CBO≥about 0.2) may be obtained when the mole fraction (x) of Al in the $Al_xGa_{1-x}As_{0.5}Sb_{0.5}$ is greater than 0, and a high CBO of 0.4 may be obtained when x is about 0.1. As shown, the simulated CBO increases as the mole fraction (x) of Al increases. As may be appreciated, FIG. 4 indicates that when a layer of $Al_xGa_{1-x}As_{0.5}Sb_{0.5}$ is used in subfin region 103, its composition may be tailored to include relatively little aluminum (thus limiting potential sidewall interaction), while at the same time providing a lattice matched epitaxial seeding surface for an overlying channel. Moreover such alloys may also enable the production of devices that with relatively high CBO between subfin region 103 and channel 105 when the mole fraction (x) of Al that is greater than 0, with a useful CBO of 0.4 expected even when x is only about 0.1. As noted above, such relatively high CBOs may limit or even prevent subfin leakage in such devices.

Figure 5:
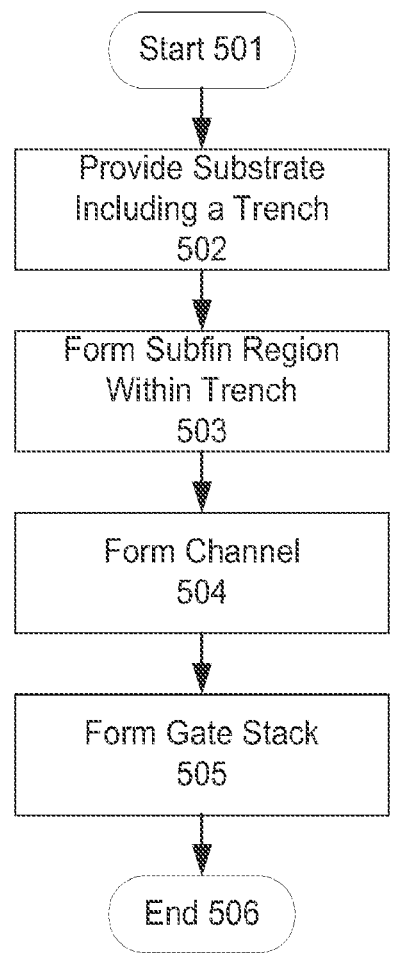
FIG. 5 is a flow chart of example operations of a method of forming a channel of a non-planar transistor consistent with the present disclosure.
Figure 6A:
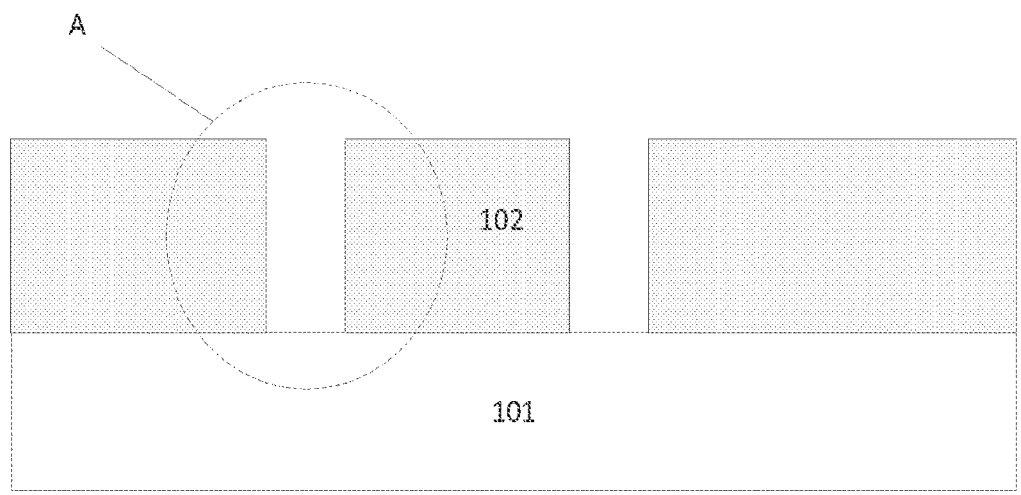
FIGS. 6A-6E stepwise illustrate one example method of forming a channel of a non-planar transistor consistent with the present disclosure.

Another aspect of the present disclosure relates to methods of making non-planar semiconductor devices including the III-V semiconductor alloys described herein. In this regard reference is made to FIG. 5, which for the sake of illustration will be described in conjunction with FIGS. 6A-6I. As shown in FIG. 5 the method begins at block 501. The method may then proceed to block 502, wherein a substrate including a trench may be provided. This concept is illustrated in FIG. 6A, which depicts a substrate 101 with trench dielectric 102 formed thereon, wherein trenches (not separately labeled) are defined by an upper surface of substrate 1091 and trench dielectric 102. It should therefore be understood that in the context of FIG. 6A, substrate 101 and trench dielectric 102 may be considered a "substrate" upon which further layers may be formed. It is also noted that for the sake of clarity and ease of understanding, FIG. 6A depicts an embodiment of a substrate in which one or more seeding layers, transition layers, etc. are not formed within a trench. As such an upper surface of substrate 101 may form a growth surface for the deposition of a layer of first III-V semiconductor alloy, as will be described later.

With the foregoing in mind, a substrate including a trench (e.g., as shown in FIG. 6A) may be provided in any suitable manner. In some embodiments, the substrate structure shown in FIG. 6A may be formed by providing a substrate (e.g., of silicon, germanium, etc.) and forming one or more hard mask layers thereon. The hard mask layers may then be processed into one or more hard mask fins. Trench dielectric 102 may then be deposited on the substrate and between/around the hard mask fin(s). Trench dielectric may then be optionally planarized, and the hard mask fins may be removed (e.g., via an etching process) to form one or more trenches consistent with the structure of FIG. 6A, i.e., which includes one or more trenches bounded by an upper surface of substrate 101 and trench sidewalls defined by trench dielectric 102.

In some embodiments the trenches formed on or in substrate 101 are suitable for use in a so-called aspect ratio trapping (ART) process. With this in mind, the height to width ratio of the trenches described herein may vary widely, e.g., from about 2:1, about 4:1, about 6:1, or even about 8:1 or more. Although FIG. 6A depicts the use of a trench including vertical sidewalls it should be understood that the sidewalls of the trenches described herein may be angled. For example, the sidewalls of the trenches described herein may be formed at an angle ranging from about 85 to about 120 degrees, such as about 85 to 95 degrees, relative to a horizontal plane of substrate 101. In some embodiments, the sidewalls of the trenches described herein are substantially vertical, i.e., are formed at an angle ranging from about 88 to about 92 degrees, relative to the horizontal plane of substrate 101.

Trench dielectric 102 may be deposited in any suitable manner. In some embodiments, trench dielectric 102 (which may be formed from the materials previously described) may be deposited on substrate 101 via chemical vapor deposition (CVD), plasma enhanced CVD (PECVD), or another suitable additive deposition process. Without limitation trench dielectric 102 is in the form of an oxide (e.g., $SiO_2$) that is deposited on substrate 101 using CVD or PECVD.

Figure 6B:
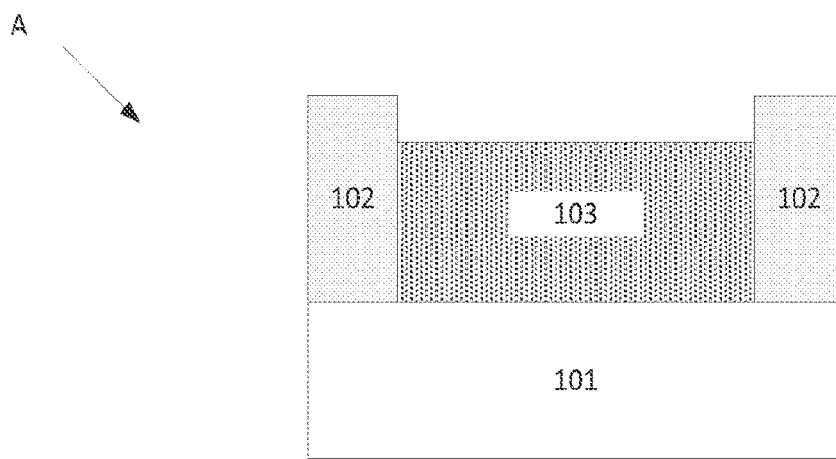

Returning to FIG. 5, the method may proceed from block 502 to block 503, pursuant to which a subfin region may be formed in one or more trenches of on or within the substrate. In some embodiments formation of the subfin includes forming one or more layers of a first III-V semiconductor alloy within the trench(es) on or within a substrate. Without limitation, in some embodiments one or more layers of first III-V semiconductor alloy (such as the materials noted above) is/are selectively deposited within a trench, e.g., using CVD, PECVD, atomic layer deposition, or another suitable technique. This concept is illustrated in FIG. 6B, which depicts the formation of subfin region 103 in a trench located at region A of FIG. 6A. In this non-limiting example, subfin region 103 is a single layer of a first III-V semiconductor alloy, which is selectively formed on substrate 101 and between trench sidewalls defined by trench dielectric 102. As noted above, however, multiple layers of first III-V semiconductor alloys as well as layers of other compositions may also be formed The layer(s) of first III-V semiconductor alloy included in subfin region 103 may be formed in any suitable manner. For example, the layer(s) of first III-V semiconductor alloy included in subfin region 103 may be formed using an epitaxial growth technique for the chosen materials, such as but not limited to metal-organic chemical vapor deposition (MOCVD), molecular beam epitaxy (MBE), combinations thereof, and the like. In some embodiments, one or more layers of subfin region 103 may epitaxially grown within a trench, and on (e.g. directly on) an upper surface of substrate 101 or one or more intervening layers deposited thereon. In some embodiments subfin region 103 includes or is formed from one or more layers of AlGaInAs or AlGaAsSb, such as those described above.

Because the layer(s) of subfin region 103 are confined to a trench, they may have sidewalls that are complementary to the trench sidewalls defined by trench dielectric 102 (or one or more trench isolation layers deposited thereon). This concept is shown in FIG. 6B, which illustrates subfin region 103 as being formed from a single layer of first III-V semiconductor alloy that has walls that are conformal to the trench sidewalls defined by trench dielectric 102.

Returning to FIG. 5, the method may proceed from block 503 to block 504, wherein a channel may be formed. Consistent with the foregoing discussion, formation of the channel may involve the formation of one or more layers of a second III-V semiconductor alloy, e.g., on or directly on an upper surface of one or more layers of the first III-V semiconductor alloy included in subfin region 103. For the sake of illustration the formation of a channel including a single layer of a second III-V semiconductor alloy will be described. However it should be understood that the channel may have any suitable structure known in the art. For example the channel may include at least one high-mobility channel layer, which may be used independently or in the context of a quantum well structure (e.g., two or three epitaxial layers of differing band gaps) that are grown on a seeding surfaced provided by one or more layers of the first III-V semiconductor alloy of subfin 103 and/or one or more layers deposited thereon.

Figure 6C:
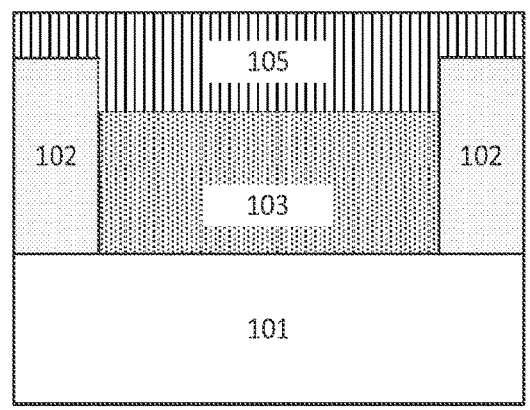
Figure 6D:
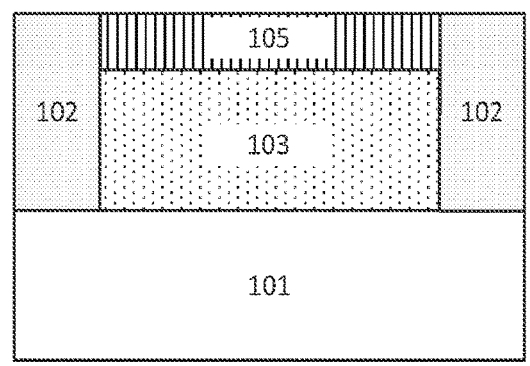
Figure 6E:
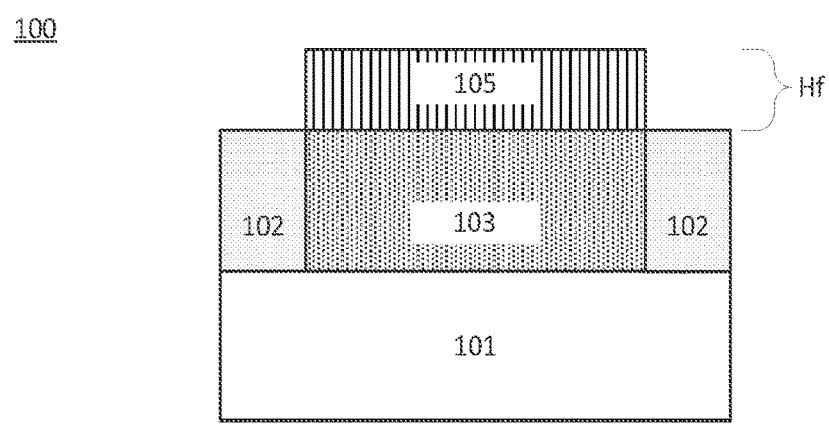

With the foregoing in mind, one example process flow that may be used to form the channel is illustrated in FIGS. 6C-E. As shown in FIG. 6C, formation of a channel 105 may be initiated by the formation of one or more layers of a second III-V semiconductor alloy, such as those described above. Formation of the layers of second III-V semiconductor alloy may be achieved in any suitable manner, such as by CVD<MOCVD, MBE, combinations thereof, and the like. Without limitation, the layer(s) of second III-V semiconductor alloy are preferably formed by an epitaxial growth technique for the selected materials, such that the layer(s) is/are hetero-epitaxially grown, e.g., on an epitaxial seeding surface provided by an upper surface of one or more of the first III-V semiconductor alloy layers included in subfin region 103, and/or one or more other layers (e.g., interlayers) deposited thereon. In any case, the layer(s) of second III-V semiconductor alloy may be selectively deposited on the upper surface of subfin region 103, or (as shown in FIG. 6C), such layers may be bulk deposited over a larger region. In the latter case and as shown in FIG. 6D, the formation of channel 105 may include a planarization step, which may reduce the height of the layer(s) forming channel 105 to about the same level as the height of trench dielectric 102.

As may be appreciated, the structure shown in FIG. 6D may be used in various types of semiconductor devices. For example, source and drain regions may be formed in channel 105, and a gate stack may be formed on an upper surface of channel 105 of FIG. 6D, e.g. so as to form a single gated transistor. While such devices are useful, for the sake of illustration the present disclosure will go on to describe an example process whereby a non-planar device such as a multigated transistor may be formed.

In this regard, formation of channel 105 may further involve recessing trench dielectric 102 such that at least a portion of channel 105 protrudes above an upper surface of trench dielectric 102. This concept is shown in FIG. 6E, which illustrates an embodiment in which trench dielectric 102 is recessed such that channel 105 extends by a height $H_f$ above an upper surface thereof. As may be appreciated, the structure of FIG. 6E is the same as that shown in FIGS. 1A and 2A, and thus may be understood to depict an example portion of a non-planar semiconductor device. In any case, recession of trench dielectric 102 may be accomplished in any suitable manner. In some embodiments for example, trench dielectric may be recessed using a selective dry or wet etching process, such as but not limited to a photochemical etching process.

Although not shown in FIGS. 6A-6I, formation of channel 105 in some embodiments involves the formation of source and drain regions, as previously described. In this regard source and drain regions may be formed within channel 105 in any suitable manner, including but not limited to processes understood in the art. For example, source and drain regions may be formed in channel 105 by doping one or more regions thereof with an appropriate N or P type dopant.

Returning to FIG. 5, the method may proceed from block 504 to block 505, pursuant to which a gate stack may be formed. In this regard a gate stack of any suitable structure may be used, and any suitable number of gates may be used. Thus while the present disclosure focuses on embodiments in which a single gate stack of a particular structure is used, it should be understood that such embodiments are for the sake of example only and that other gate structures are envisioned and encompassed by the present disclosure.

Figure 6F:
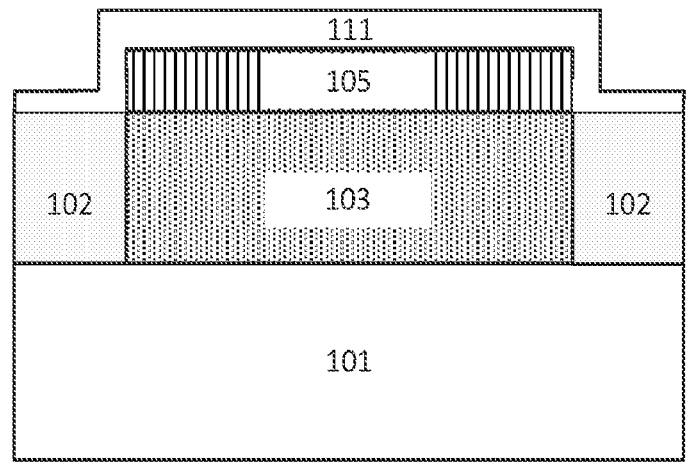
FIGS. 6F-6I stepwise illustrate the formation of example non-planar transistors consistent with the present disclosure.
Figure 6G:
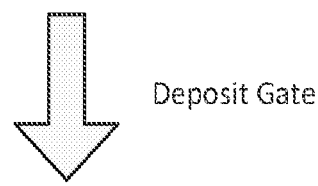
Figure 6G:
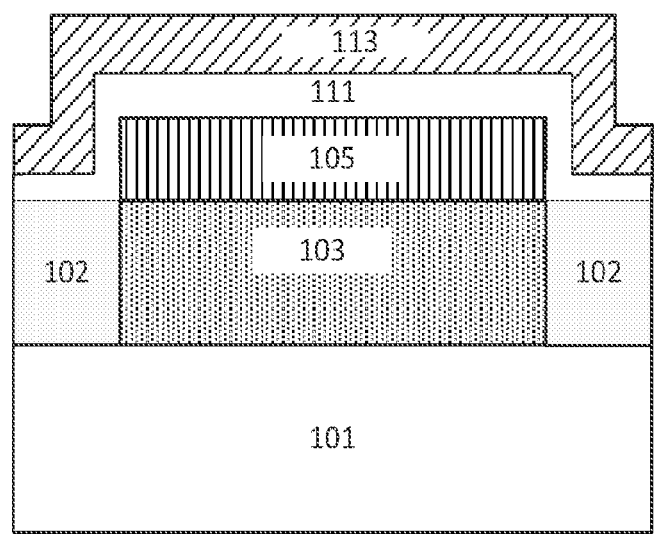
Figure 6H:
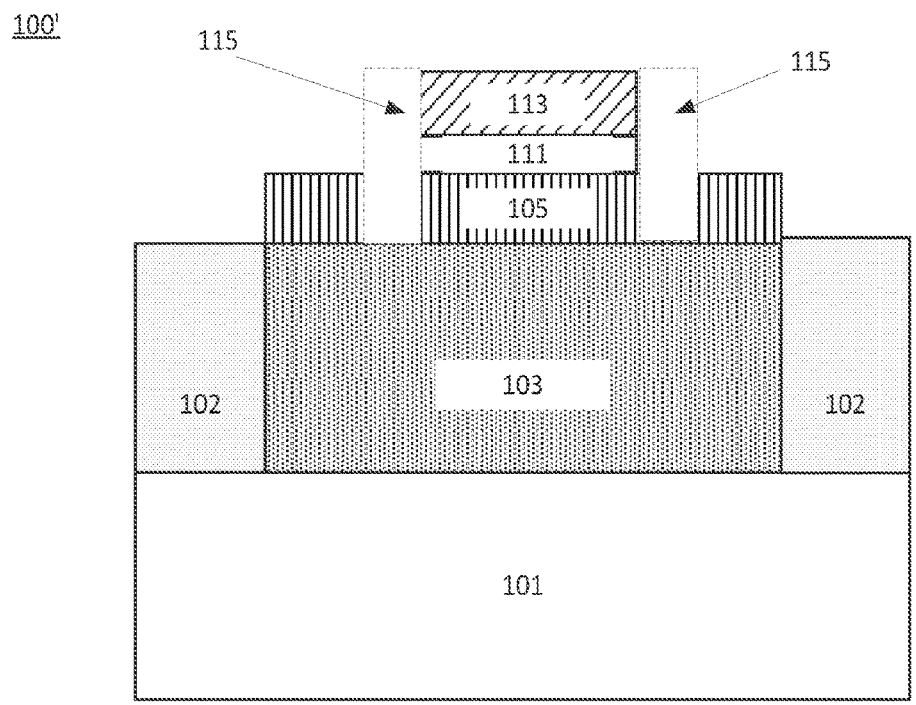

With the foregoing in mind reference is made to FIGS. 6F-6H, which depict one example of a process flow that may be used to form a gate stack consistent with the present disclosure. As shown in FIG. 6F, formation of a gate stack may begin with the deposition of a layer of gate dielectric 111, which may isolate all or a portion of the channel 105 from a gate, as generally understood in the art. A layer 113 of gate electrode material may then be deposited on the gate dielectric, as generally shown in FIG. 6G. Deposition of the layer 111 of gate dielectric and the layer 113 of gate electrode material may be accomplished in any suitable manner, e.g., by a CVD process, MOCVD process, PECVD process, atomic layer deposition (ALD) process, a sputtering process, combinations thereof, and the like. Although the present disclosure envisions embodiments in which the layer 111 of gate dielectric and the layer 113 of gate electrode material are selectively deposited channel 105, FIGS. 6F and G depict an embodiment in which such layers are deposited over a wider area.

In some embodiments, layer 113 of gate electrode material is composed of a metal material, and layer 111 of gate dielectric is composed of a high-K dielectric material. For example in some embodiments the layer 111 of gate dielectric is formed from one or more of hafnium oxide, hafnium oxy-nitride, hafnium silicate, lanthanum oxide, zirconium oxide, tantalum oxide, barium strontium titanate, barium titanate, strontium titanate, yttrium oxide, aluminum oxide, lead scandium tantalum oxide, lead zinc niobate, or a combination thereof. Furthermore a portion of layer 111 of gate dielectric may include a layer of native oxide thereof.

In an embodiment, the layer 113 of gate electrode material is composed of a metal layer such as, but not limited to, one or more layers of a metal nitride, metal carbide, metal silicide, metal aluminide, hafnium, Zirconium, titanium, tantalum, aluminum, ruthenium, palladium, platinum, cobalt, nickel or conductive metal oxides. In a specific embodiment, the layer 113 is composed of a non-work function-setting fill material formed above a metal work function-setting layer. In an embodiment, the layer 113 is composed of a P-type material. As shown in FIG. 6H, the gate stack may also include gate spacers 115.

After the layer(s) 111, 113 of gate dielectric and gate electrode are formed (as shown in FIG. 6G), layer 111, 113 may be processed into a desired geometry, e.g., by a dry or wet etching process or another selective material removal process. This concept is illustrated in FIG. 6H, which depicts layers 111, 113 as being patterned to form a gate stack over a portion of channel 105. For the sake of illustration only, FIG. 6H is illustrated with layer 111 of gate dielectric showing. It should be understood however that when layers 111 and 113 are deposited, they may be formed over one or more sides of channel 105, e.g., such that they extend into and out of the plane of the paper in FIG. 6H. This concept is best illustrated in FIG. 1B, which shows the extension of the layer(s) of gate dielectric 111 and gate electrode 113 about channel 105. Gate spacers 115 may also be formed, as noted above. It may therefore be understood that FIG. 6H depicts the same structure as shown in FIG. 2B. That is, FIG. 6H depicts the same non-planar semiconductor device 100" that is shown in FIG. 2B.

Figure 6I:
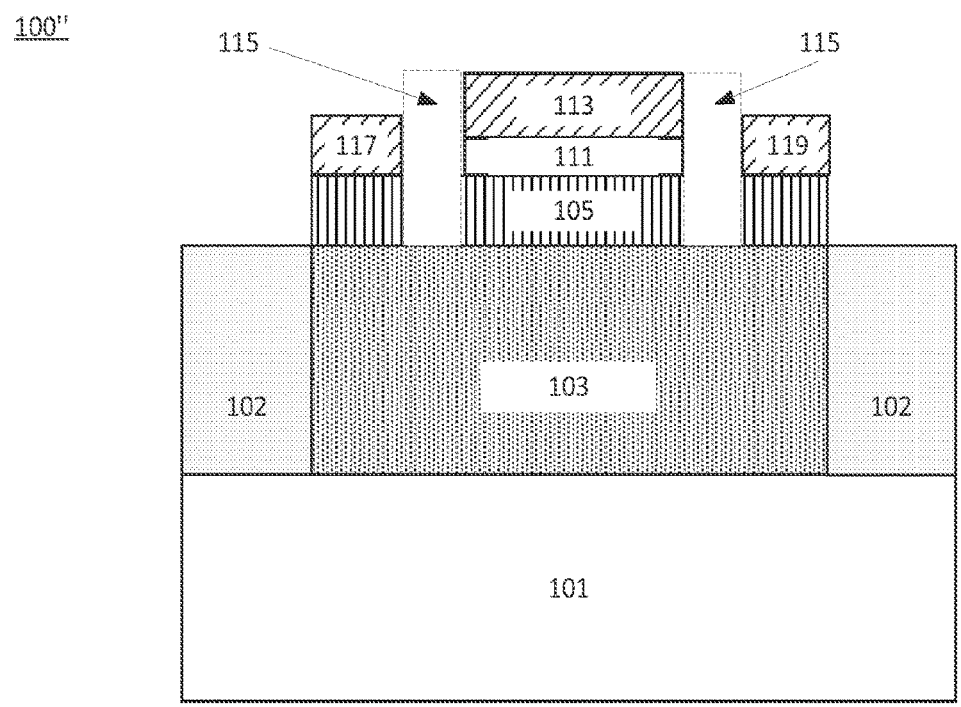
Figure 7:
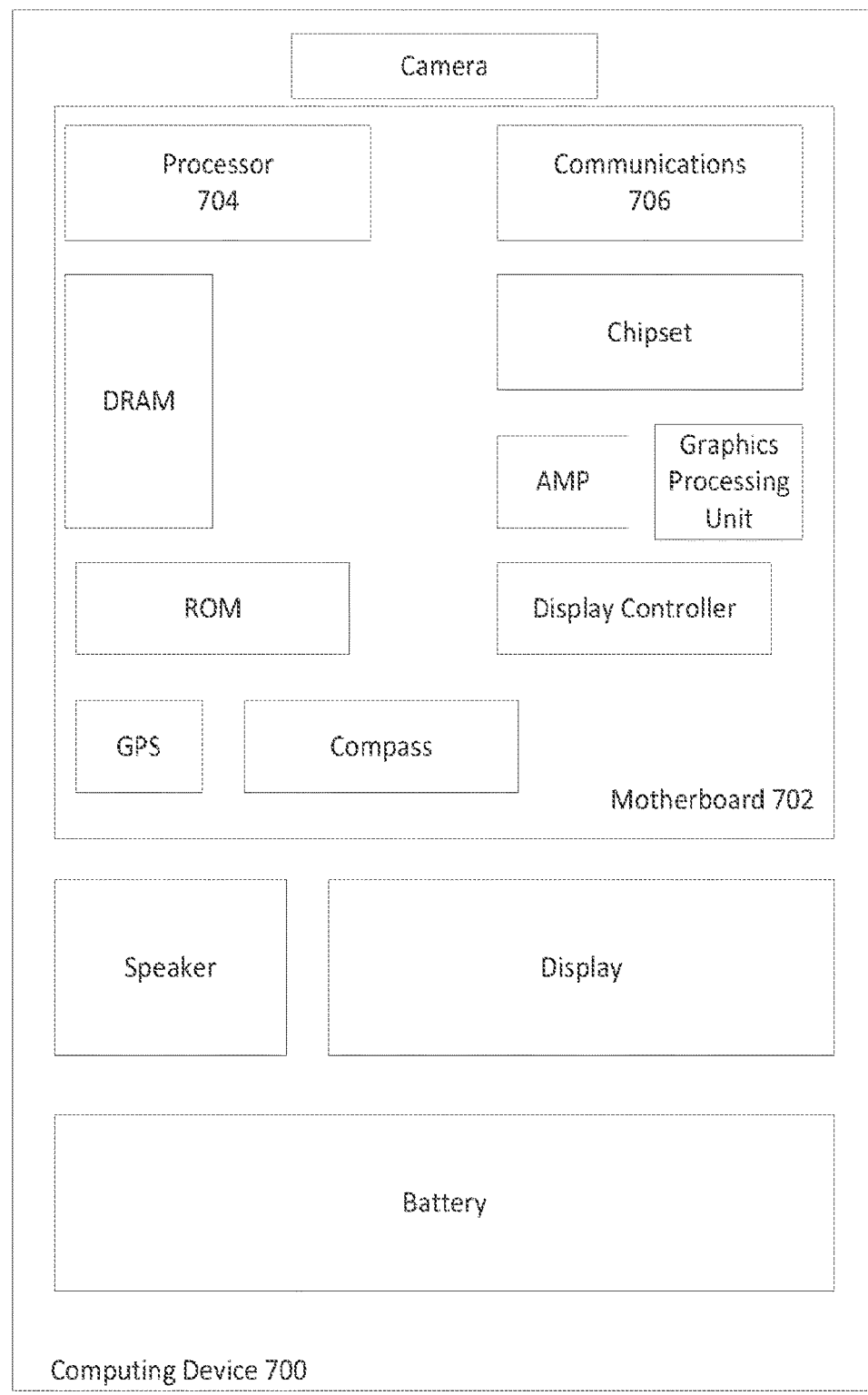
FIG. 7 is a block diagram of an example computing device consistent with the present disclosure.

As noted above the devices described herein in some embodiments include a raised source and drain. With this in mind, one example process flow depicting the formation of such a device is shown in FIGS. 6H and 6I. In this case, formation of the structure of FIG. 6I may proceed as previously described, with the exception that the formation of source and drain regions within channel 105 need not occur. Rather pursuant to these embodiments, formation of a semiconductor device including a raised source and drain may proceed by forming gate spacers 115 as discussed above. Raised source 117 and raised drain regions 119 may then be formed on an exposed portion of channel 105. Raised source 117 and drain regions 119 may be any suitable high mobility material, including high mobility N and P type semiconductive material. Moreover the layer(s) forming raised source 117 and drain 119 may be formed in any suitable manner, such as by CVD, MOCVD, PECVD, MBE, combinations thereof, and the like.

Returning to FIG. 5, once the gate stack has been formed the method may proceed from block 505 to block 506, whereupon the method may end.

Another aspect of the present disclosure relates to a computing device including one or more non-planar semiconductor devices consistent with the present disclosure. In this regard reference is made to FIG. 8, which illustrates a computing device 700 in accordance with one implementation of the present disclosure. The computing device 700 houses a board 702 (e.g., a motherboard). The board 702 may include a number of components, including but not limited to a processor 704 and at least one communication chip 706. The processor 704 is physically and electrically coupled to the board 702. In some implementations the at least one communication chip 706 is also physically and electrically coupled to the board 802. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the present disclosure, the integrated circuit die of the processor includes one or more devices, such as MOSFET and/or non-planar transistors built in accordance with implementations of the present disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the present disclosure, the integrated circuit die of the communication chip includes one or more devices, such as MOSFET and/or non-planar transistors built in accordance with implementations of the present disclosure.

In further implementations, another component housed within the computing device 700 may contain an integrated circuit die that includes one or more devices, such as MOSFET and/or non-planar transistors built in accordance with implementations of the present disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

EXAMPLES

The following examples enumerate additional non-limiting embodiments of the present disclosure.

Example 1

According to this example there is provided a semiconductor device, including: a substrate including a trench defined by at least two trench sidewalls; a first III-V semiconductor alloy on the substrate and within the trench; a second III-V semiconductor alloy on the first III-V semiconductor alloy; wherein: the second III-V semiconductor alloy is epitaxially grown on the first III-V semiconductor alloy; and a conduction band offset between the first III-V semiconductor alloy and the second III-V semiconductor alloy is greater than or equal to about 0.3 electron volts.

Example 2

This example includes any or all of the features of example 1, wherein the trench sidewalls include a dielectric oxide.

Example 3

This example includes any or all of the features of example 2, wherein the dielectric oxide is a silicon oxide.

Example 4

This example includes any or all of the features of example 2, wherein the first III-V semiconductor alloy is in contact with the dielectric oxide.

Example 5

This example includes any or all of the features of example 1, wherein the first III-V semiconductor alloy is a quaternary III-V semiconductor alloy including aluminum.

Example 6

This example includes any or all of the features of example 5, wherein the quaternary III-V semiconductor alloy is selected from an alloy of aluminum gallium indium and arsenic (AlGaInAs), an alloy of aluminum gallium arsenic and antimony (AlGaAsSb) and combinations thereof.

Example 7

This example includes any or all of the features of example 6, wherein: the quaternary III-V semiconductor alloy is an AlGaInAs alloy of the formula $Al_xGa_{0.48-x}In_{0.52}As_y$; at least a portion of the Al, Ga, and In are present in a group III sublattice of the quaternary III-V semiconductor alloy; x is the mole fraction of Al and ranges from greater than 0 to less than 0.48; at least a portion of the As is present in a group V sublattice of the quaternary III-V semiconductor alloy; and y is the mole fraction of As and is equal to 1.

Example 8

This example includes any or all of the features of example 7, wherein x ranges from about 0.3 to less than 0.48.

Example 9

This example includes any or all of the features of example 6, wherein: the quaternary III-V semiconductor alloy is an AlGaAsSb alloy of the formula $Al_xGa_{1-x}As_ySb_{1-y}$; at least a portion of the Al and Ga are present in a group III sublattice of the quaternary III-V semiconductor alloy; x is the mole fraction of Al and ranges from greater than 0 to less than 0.5; at least a portion of the As and Sb are present in a group V sublattice of the quaternary III-V semiconductor alloy; and y is the mole fraction of As and is less than or equal to 0.5.

Example 10

This example includes any or all of the features of example 9, wherein x ranges from about 0.1 to about 0.4.

Example 11

This example includes any or all of the features of example 1, wherein the second III-V semiconductor alloy includes a ternary III-V semiconductor alloy that is lattice matched to the first III-V semiconductor alloy.

Example 12

This example includes any or all of the features of example 11, wherein the second III-V semiconductor alloy forms as least a portion of a channel of the semiconductor device.

Example 13

This example includes any or all of the features of example 11, wherein the ternary III-V semiconductor alloy is an alloy of indium, gallium and arsenic (InGaAs).

Example 14

This example includes any or all of the features of example 13, wherein the first III-V semiconductor alloy is selected from an alloy of aluminum, gallium, indium, and arsenic (AlGaInAs) and an alloy of aluminum, gallium, arsenic, and antimony (AlGaAsSb).

Example 15

This example includes any or all of the features of example 14, wherein: the first III-V semiconductor alloy is an AlGaInAs alloy of the formula $Al_xGa_{0.48-x}In_{0.52}As_y$; at least a portion of the Al, Ga, and In are present in a group III sublattice of the quaternary III-V semiconductor alloy; x is the mole fraction of Al and ranges from greater than 0 to less than 0.48; at least a portion of the As is present in a group V sublattice of the quaternary III-V semiconductor alloy; and y is the mole fraction of As and is equal to 1.

Example 16

This example includes any or all of the features of example 15, wherein x ranges from about 0.3 to less than 0.48.

Example 17

This example includes any or all of the features of example 14, wherein: the first III-V semiconductor alloy is an AlGaAsSb alloy of the formula $Al_xGa_{1-x}As_ySb_{1-y}$; at least a portion of the Al and Ga are present in a group III sublattice of the quaternary III-V semiconductor alloy; x is the mole fraction of Al and ranges from greater than 0 to less than 0.5; at least a portion of the As and Sb are present in a group V sublattice of the quaternary III-V semiconductor alloy; and y is the mole fraction of As and is less than or equal to 0.5.

Example 18

This example includes any or all of the features of example 17, wherein x ranges from about 0.1 to about 0.4.

Example 19

This example includes any or all of the features of example 1, wherein: the second III-V semiconductor alloy forms as least a portion of a channel of the semiconductor device; and the device further includes a gate stack formed on the second III-V semiconductor alloy, the gate stack including a gate electrode.

Example 20

This example includes any or all of the features of example 19, wherein: at least an exposed portion of the second III-V semiconductor alloy protrudes above an upper surface of the trench sidewalls, the exposed portion including an upper surface and at least first and second sides; and the gate electrode is disposed on the upper surface and at least one of the first and second sides of the exposed portion.

Example 21

This example includes any or all of the features of example 20, wherein the gate electrode is disposed on the upper surface and the both the first and second sides of the exposed portion.

Example 22

This example includes any or all of the features of example 20, wherein the device is a fin-based transistor.

Example 23

According to this example there is provided a method of making a semiconductor device, including: forming a layer of a first III-V semiconductor alloy on a substrate and within a trench defined by at least two trench sidewalls; epitaxially forming a layer of a second III-V semiconductor alloy on the first III-V semiconductor alloy; wherein a conduction band offset between the first III-V semiconductor alloy and the second III-V semiconductor alloy is greater than or equal to about 0.3 electron volts.

Example 24

This example includes any or all of the features of example 23, wherein the trench sidewalls comprise a dielectric oxide.

Example 25

This example includes any or all of the features of example 24, wherein the dielectric oxide is a silicon oxide.

Example 26

This example includes any or all of the features of example 24, wherein forming the first III-V semiconductor alloy includes forming a layer of the first III-V semiconductor alloy within the trench, wherein at least a portion of the layer of first III-V semiconductor alloy contacts the dielectric oxide.

Example 27

This example includes any or all of the features of example 23, wherein the first III-V semiconductor alloy is a quaternary III-V semiconductor alloy including aluminum.

Example 28

This example includes any or all of the features of example 27, wherein the quaternary III-V semiconductor alloy is selected from an alloy of aluminum gallium indium and arsenic (AlGaInAs), an alloy of aluminum gallium arsenic and antimony (AlGaAsSb) and combinations thereof.

Example 29

This example includes any or all of the features of example 28, wherein: the quaternary III-V semiconductor alloy is an AlGaInAs alloy of the formula $Al_xGa_{0.48-x}In_{0.52}As_y$; at least a portion of the Al, Ga, and In are present in a group III sublattice of the quaternary III-V semiconductor alloy; x is the mole fraction of Al and ranges from greater than 0 to less than 0.48; at least a portion of the As is present in a group V sublattice of the quaternary III-V semiconductor alloy; and y is the mole fraction of As and is equal to 1.

Example 30

This example includes any or all of the features of example 29, wherein x ranges from about 0.3 to less than 0.48.

Example 31

This example includes any or all of the features of example 28, wherein: the quaternary III-V semiconductor alloy is an AlGaAsSb alloy of the formula $Al_xGa_{1-x}As_ySb_{1-y}$; at least a portion of the Al and Ga are present in a group III sublattice of the quaternary III-V semiconductor alloy; x is the mole fraction of Al and ranges from greater than 0 to less than 0.5; at least a portion of the As and Sb are present in a group V sublattice of the quaternary III-V semiconductor alloy; and y is the mole fraction of As and is less than or equal to 0.5.

Example 32

This example includes any or all of the features of example 31, wherein x ranges from about 0.1 to about 0.4.

Example 33

This example includes any or all of the features of example 23, wherein the second III-V semiconductor alloy includes a ternary III-V semiconductor alloy that is lattice matched to the first III-V semiconductor alloy.

Example 34

This example includes any or all of the features of example 33, wherein the second III-V semiconductor alloy forms as least a portion of a channel of the semiconductor device.

Example 35

This example includes any or all of the features of example 33, wherein the ternary III-V semiconductor alloy is an alloy of indium, gallium and arsenic (InGaAs).

Example 36

This example includes any or all of the features of example 35, wherein the first III-V semiconductor alloy is selected from an alloy of aluminum, gallium, indium, and arsenic (AlGaInAs) and an alloy of aluminum, gallium, arsenic, and antimony (AlGaAsSb).

Example 37

This example includes any or all of the features of example 36, wherein: the first III-V semiconductor alloy is an AlGaInAs alloy of the formula $Al_xGa_{0.48-x}In_{0.52}As_y$; at least a portion of the Al, Ga, and In are present in a group III sublattice of the quaternary III-V semiconductor alloy; x is the mole fraction of Al and ranges from greater than 0 to less than 0.48; at least a portion of the As is present in a group V sublattice of the quaternary III-V semiconductor alloy; and y is the mole fraction of As and is equal to 1.

Example 38

This example includes any or all of the features of example 37, wherein x ranges from about 0.3 to less than 0.48.

Example 39

This example includes any or all of the features of example 36, wherein: the first III-V semiconductor alloy is an AlGaAsSb alloy of the formula $Al_xGa_{1-x}As_ySb_{1-y}$; at least a portion of the Al and Ga are present in a group III sublattice of the quaternary III-V semiconductor alloy; x is the mole fraction of Al and ranges from greater than 0 to less than 0.5; at least a portion of the As and Sb are present in a group V sublattice of the quaternary III-V semiconductor alloy; and y is the mole fraction of As and is less than or equal to 0.5.

Example 40

This example includes any or all of the features of example 39, wherein x ranges from about 0.1 to about 0.4.

Example 41

This example includes any or all of the features of example 23, wherein: the second III-V semiconductor alloy forms as least a portion of a channel of the semiconductor device; and the method further includes forming a gate stack on the second III-V semiconductor alloy, the gate stack including a gate electrode.

Example 42

This example includes any or all of the features of example 41, wherein the epitaxially forming includes epitaxially growing the layer of second III-V semiconductor alloy on an upper surface of the layer of first III-V semiconductor alloy within the trench; and the method further includes: recessing the trench sidewalls such that an exposed portion of the second III-V semiconductor alloy protrudes above an upper surface of the trench sidewalls, the exposed portion including an upper surface and at least first and second sides; and forming the gate stack includes forming the gate electrode on at least the upper surface and at least one of the first and second sides of the exposed portion.

Example 43

This example includes any or all of the features of example 42, wherein forming the gate stack includes forming the gate electrode on the upper surface and the both the first and second sides of the exposed portion.

Example 44

This example includes any or all of the features of example 42, wherein the semiconductor device is a fin-based transistor.

Example 45

According to this example there is provided a computing device including circuitry, the circuitry including at least one semiconductor device including: a substrate including a trench defined by at least two trench sidewalls; a first III-V semiconductor alloy on the substrate and within the trench; a second III-V semiconductor alloy on the first III-V semiconductor alloy; wherein: the second III-V semiconductor alloy is epitaxially grown on the first III-V semiconductor alloy; and a conduction band offset between the first III-V semiconductor alloy and the second III-V semiconductor alloy is greater than or equal to about 0.3 electron volts.

Example 46

This example includes any or all of the features of example 45, wherein the trench sidewalls comprise a dielectric oxide.

Example 47

This example includes any or all of the features of example 46, wherein the dielectric oxide is a silicon oxide.

Example 48

This example includes any or all of the features of example 46, wherein the first III-V semiconductor alloy is in contact with the dielectric oxide.

Example 49

This example includes any or all of the features of example 45, wherein the first III-V semiconductor alloy is a quaternary III-V semiconductor alloy including aluminum.

Example 50

This example includes any or all of the features of example 49, wherein the quaternary III-V semiconductor alloy is selected from an alloy of aluminum gallium indium and arsenic (AlGaInAs), an alloy of aluminum gallium arsenic and antimony (AlGaAsSb) and combinations thereof.

Example 51

This example includes any or all of the features of example 50, wherein: the quaternary III-V semiconductor alloy is an AlGaInAs alloy of the formula $Al_xGa_{0.48-x}In_{0.52}As_y$; at least a portion of the Al, Ga, and In are present in a group III sublattice of the quaternary III-V semiconductor alloy; x is the mole fraction of Al and ranges from greater than 0 to less than 0.48; at least a portion of the As is present in a group V sublattice of the quaternary III-V semiconductor alloy; and y is the mole fraction of As and is equal to 1.

Example 52

This example includes any or all of the features of example 51, wherein x ranges from about 0.3 to less than 0.48.

Example 53

This example includes any or all of the features of example 50, wherein: the quaternary III-V semiconductor alloy is an AlGAAsSb alloy of the formula $Al_xGa_{1-x}As_ySb_{1-y}$; at least a portion of the Al and Ga are present in a group III sublattice of the quaternary III-V semiconductor alloy; x is the mole fraction of Al and ranges from greater than 0 to less than 0.5; at least a portion of the As and Sb are present in a group V sublattice of the quaternary III-V semiconductor alloy; and y is the mole fraction of As and is less than or equal to 0.5.

Example 54

This example includes any or all of the features of example 53, wherein x ranges from about 0.1 to about 0.4.

Example 55

This example includes any or all of the features of example 45, wherein the second III-V semiconductor alloy includes a ternary III-V semiconductor alloy that is lattice matched to the first III-V semiconductor alloy.

Example 56

This example includes any or all of the features of example 55, wherein the second III-V semiconductor alloy forms as least a portion of a channel of the semiconductor device.

Example 57

This example includes any or all of the features of example 55, wherein the ternary III-V semiconductor alloy is an alloy of indium, gallium and arsenic (InGaAs).

Example 58

This example includes any or all of the features of example 57, wherein the first III-V semiconductor alloy is selected from an alloy of aluminum, gallium, indium, and arsenic (AlGaInAs) and an alloy of aluminum, gallium, arsenic, and antimony (AlGaAsSb).

Example 59

This example includes any or all of the features of example 58, wherein: the first III-V semiconductor alloy is an AlGaInAs alloy of the formula $Al_xGa_{0.48-x}In_{0.52}As_y$; at least a portion of the Al, Ga, and In are present in a group III sublattice of the quaternary III-V semiconductor alloy; x is the mole fraction of Al and ranges from greater than 0 to less than 0.48; at least a portion of the As is present in a group V sublattice of the quaternary III-V semiconductor alloy; and y is the mole fraction of As and is equal to 1.

Example 60

This example includes any or all of the features of example 59, wherein x ranges from about 0.3 to less than 0.48.

Example 61

This example includes any or all of the features of example 58, wherein: the first III-V semiconductor alloy is an AlGaAsSb alloy of the formula $Al_xGa_{1-x}As_ySb_{1-y}$; at least a portion of the Al and Ga are present in a group III sublattice of the quaternary III-V semiconductor alloy; x is the mole fraction of Al and ranges from greater than 0 to less than 0.5; at least a portion of the As and Sb are present in a group V sublattice of the quaternary III-V semiconductor alloy; and y is the mole fraction of As and is less than or equal to 0.5.

Example 62

This example includes any or all of the features of example 61, wherein x ranges from about 0.1 to about 0.4.

Example 63

This example includes any or all of the features of example 45, wherein: the second III-V semiconductor alloy forms as least a portion of a channel of the semiconductor device; and the device further includes a gate stack formed on the second III-V semiconductor alloy, the gate stack including a gate electrode.

Example 64

This example includes any or all of the features of example 63, wherein: at least an exposed portion of the second III-V semiconductor alloy protrudes above an upper surface of the trench sidewalls, the exposed portion including an upper surface and at least first and second sides; and the gate electrode is disposed on the upper surface and at least one of the first and second sides of the exposed portion.

Example 65

This example includes any or all of the features of example 64, wherein the gate electrode is disposed on the upper surface and the both the first and second sides of the exposed portion.

Example 66

This example includes any or all of the features of example 65, wherein the device is a fin-based transistor.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A semiconductor device, comprising:
    a substrate comprising a trench defined by at least two trench sidewalls;
    a first III-V semiconductor alloy on the substrate and within the trench, wherein the first III-V semiconductor alloy is a quaternary III-V semiconductor alloy selected from an alloy of aluminum, gallium, indium, and arsenic (AlGaInAs); an alloy of aluminum, gallium, arsenic, and antimony (AlGaAsSb); and combinations thereof;
    a second III-V semiconductor alloy on the first III-V semiconductor alloy;
    wherein:
    the second III-V semiconductor alloy is epitaxially grown on the first III-V semiconductor alloy; and
    a conduction band offset between the first III-V semiconductor alloy and the second III-V semiconductor alloy is greater than or equal to about 0.3 electron volts.

2. The semiconductor device of claim 1, wherein the trench sidewalls comprise a dielectric oxide.

3. The semiconductor device of claim 1, wherein:
    the quaternary III-V semiconductor alloy is an AlGaInAs alloy of the formula $Al_xGa_{0.48-x}In_{0.52}As_y$;
    at least a portion of the Al, Ga, and In are present in a group III sublattice of the quaternary III-V semiconductor alloy;
    x is the mole fraction of Al and ranges from greater than 0 to less than 0.48;
    at least a portion of the As is present in a group V sublattice of the quaternary III-V semiconductor alloy; and
    y is the mole fraction of As and is equal to 1.

4. The semiconductor device of claim 3, wherein the second III-V semiconductor alloy comprises a ternary III-V semiconductor alloy of indium, gallium and arsenic (InGaAs).

5. The semiconductor device of claim 1, wherein:
    the quaternary III-V semiconductor alloy is an AlGaAsSb alloy of the formula $Al_xGa_{1-x}As_ySb_{1-y}$;
    at least a portion of the Al and Ga are present in a group III sublattice of the quaternary III-V semiconductor alloy;
    x is the mole fraction of Al and ranges from greater than 0 to less than 0.5;
    at least a portion of the As and Sb are present in a group V sublattice of the quaternary III-V semiconductor alloy; and
    y is the mole fraction of As and is less than or equal to 0.5.

6. The semiconductor device of claim 5, wherein the second III-V semiconductor alloy comprises a ternary III-V semiconductor alloy of indium, gallium and arsenic (InGaAs).

7. The semiconductor device of claim 1, wherein:
    the second III-V semiconductor alloy forms as least a portion of a channel of the semiconductor device; and
    the device further comprises a gate stack formed on the second III-V semiconductor alloy, the gate stack comprising a gate electrode.

8. The semiconductor device of claim 7, wherein the device is a fin-based transistor.

9. A computing device comprising circuitry, the circuitry comprising at least one semiconductor device comprising:

a substrate comprising a trench defined by at least two trench sidewalls;

a first III-V semiconductor alloy on the substrate and within the trench, wherein the first III-V semiconductor alloy is a quaternary III-V semiconductor alloy; selected from an alloy of aluminum, gallium, indium, and arsenic (AlGaInAs); an alloy of aluminum, gallium, arsenic and antimony (AlGaAsSb); and combinations thereof;

a second III-V semiconductor alloy on the first III-V semiconductor alloy;

wherein:

the second III-V semiconductor alloy is epitaxially grown on the first III-V semiconductor alloy; and a conduction band offset between the first III-V semiconductor alloy and the second III-V semiconductor alloy is greater than or equal to about 0.3 electron volts.

10. The computing device of claim 9, wherein the trench sidewalls comprise a dielectric oxide.

11. The computing device of claim 9, wherein:

the quaternary III-V semiconductor alloy is an AlGaInAs alloy of the formula $Al_xGa_{0.48-x}In_{0.52}As_y$;

at least a portion of the Al, Ga, and In are present in a group III sublattice of the quaternary III-V semiconductor alloy;

x is the mole fraction of Al and ranges from greater than 0 to less than 0.48;

at least a portion of the As is present in a group V sublattice of the quaternary III-V semiconductor alloy; and y is the mole fraction of As and is equal to 1.

12. The computing device of claim 11, wherein the second III-V semiconductor alloy comprises a ternary III-V semiconductor alloy of indium, gallium and arsenic (InGaAs).

13. The computing device of claim 9, wherein:

the quaternary III-V semiconductor alloy is an AlGaAsSb alloy of the formula $Al_xGa_{1-x}As_ySb_{1-y}$;

at least a portion of the Al and Ga are present in a group III sublattice of the quaternary III-V semiconductor alloy;

x is the mole fraction of Al and ranges from greater than 0 to less than 0.5;

at least a portion of the As and Sb are present in a group V sublattice of the quaternary III-V semiconductor alloy; and y is the mole fraction of As and is less than or equal to 0.5.

14. The computing device of claim 13, wherein the second III-V semiconductor alloy comprises a ternary III-V semiconductor alloy of indium, gallium and arsenic (InGaAs).

15. The computing device of claim 9, wherein:

the second III-V semiconductor alloy forms as least a portion of a channel of the semiconductor device; and the device further comprises a gate stack formed on the second III-V semiconductor alloy, the gate stack comprising a gate electrode.

* * * * *